(12) United States Patent
Aiba

(10) Patent No.: US 7,173,253 B2
(45) Date of Patent: Feb. 6, 2007

(54) OBJECT-MOVING METHOD, OBJECT-MOVING APPARATUS, PRODUCTION PROCESS AND PRODUCED APPARATUS

(75) Inventor: Toshiaki Aiba, Fujisawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/542,145

(22) PCT Filed: Jan. 30, 2004

(86) PCT No.: PCT/JP2004/000963

§ 371 (c)(1),
(2), (4) Date: Jul. 13, 2005

(87) PCT Pub. No.: WO2004/068538

PCT Pub. Date: Aug. 12, 2004

(65) Prior Publication Data

US 2006/0131269 A1    Jun. 22, 2006

(30) Foreign Application Priority Data

Jan. 31, 2003   (JP) ................ 2003-023819

(51) Int. Cl.
*H01J 49/04* (2006.01)
*H01J 37/305* (2006.01)
*G01N 1/02* (2006.01)

(52) U.S. Cl. ............. 250/442.11; 250/440.11; 250/398; 250/400

(58) Field of Classification Search ............ None
See application file for complete search history.

(56) References Cited

U.S. PATENT DOCUMENTS

2005/0270507 A1* 12/2005 Kondo ............... 355/53

FOREIGN PATENT DOCUMENTS

| JP | 9-185950 | 7/1997 |
| JP | 11-258130 | 9/1999 |
| JP | 2001-272316 | 10/2001 |

OTHER PUBLICATIONS

International Search Report mailed Jul. 30, 2004, in corresponding PCT patent application No. PCT/JP2004/000963, and Written Opinion, undated.
Minami, Kazuyuki, et al. "YAG Laser Assisted Etching For Releasing Silicon Micro Structure," Proceedings of the workshop on Micro Electro Mechanical Systems (MEMS), IEEE, Feb. 7, 1993, pp. 53-58.

(Continued)

*Primary Examiner*—Nikita Wells
(74) *Attorney, Agent, or Firm*—Fitzpatrick, Cella, Harper & Scinto

(57) ABSTRACT

A method of moving an object includes a step of fixing the object to an object-moving device, a step of moving the object to a prescribed position by the object-moving device, and a step of releasing the object from the object-moving device. The fixing step includes forming a deposit for fixation of the object to the object-moving device by applying a first corpuscular beam in a first gas to form a deposit. The releasing step includes etching the deposit by applying a second corpuscular beam in contact with a second gas.

19 Claims, 24 Drawing Sheets

OTHER PUBLICATIONS

Reyntjens, S. and Robert Puers. "A review of focused ion beam applications in microsystem technology," Journal of Micromechanics and Microengineering, vol. 11, No. 4, Jul. 2001, pp. 287-300.

Terrill, R.E., et al. "Laser Chemical Vapor Deposition for Microelectronics Production," Aerospace Conference, IEEE, Mar. 21, 1998, pp. 377-382.

* cited by examiner

OBJECT-MOVING METHOD, OBJECT-MOVING APPARATUS, PRODUCTION PROCESS AND PRODUCED APPARATUS

TECHNICAL FIELD

The object-moving method and apparatus therefor of the present invention is useful for picking up, moving, and releasing an object surely in wide application fields, especially useful for moving a small object.

BACKGROUND ART

Various techniques of moving an object are employed from old times for assemblage of mechanical products and other fields, and the techniques are essential in production of engineering products. In recent years, with technical development of MEMS (micro electromechanical systems) and NEMS (nano electromechanical systems), techniques for movement (or transfer) of micro-sized objects are attracting attention. More specifically, the techniques of the MEMS and the NEMS intend to produce novel devices by working a micro object of millimeters, micrometers, or nanometers in size with a working size of micrometers or nanometers. In such working, a technique of moving a micro-sized object of millimeters, micrometers, or nanometers is one of essential techniques.

The micro-sized object can be moved more surely at least by picking up, moving, and releasing under observation with a microscope (optical microscope, electron microscope, ion microscope, probe microscope, ultrasonic microscope, etc.).

The conventional techniques for moving a micro object are exemplified by (1) manipulation techniques employing an electrostatic force, and (2) manipulation techniques employing FIB (a focused ion beam).

By the above technique (1), an object to be moved is picked up electrostatically by bringing close thereto an object-moving means having insulating portion; the object is moved by a moving means; and then the object is released by eliminating or decreasing the electrostatic force.

For example, by Japanese Patent Application Laid-Open No. 2001-272316, a thin specimen prepared by FIB for TEM (transmission electron microscopy) is picked up from a semiconductor substrate with a micropipette composed of an insulator bar and is allowed to drop onto a TEM observation mesh.

By the technique (2), an object-moving means is kept close to an object, a deposit for adhesion is formed by projection of FIB at a prescribed site; the adhering object is picked up, and moved by an object-moving means; and thereafter the moved object is released by etching the deposit by projection of FIB.

Japanese Patent Application Laid-Open No. H11-258130 discloses a technique for preparation of a TEM specimen: the TEM specimen is picked up by fixation to a probe by fixing deposition and is fixed onto an FIB-TEM observation mesh by fixing deposition, and the probe is cut off.

However, of the above conventional techniques for moving an object, the manipulation technique (1) employing an electrostatic force has a disadvantage that the moved object cannot be released and placed exactly onto an intended state (position, direction, etc.) because the movement object cannot readily be allowed to adhere to an intended position in an intended direction by the electrostatic force by bringing the object close to the object-moving means. The technique has a further disadvantage that the moved object is sometimes kept adhering to the object-moving means and is not released when the static electricity for adhesion is not completely eliminated from the object-moving means at the time of the release, or by other reasons.

The above-manipulation technique (2) employing FIB uses a deposit for the adhesion for more exact pick-up and release of the object than the manipulation technique (1) employing the electrostatic force. This technique (2) may cause damage of the movement object by FIB irradiation or may leave a residue of the object-moving means on the moved object disadvantageously. This damage or residue will not cause a problem in the case like sampling of a TEM specimen. However, the damage or residue often causes a serious problem in moving a micro part or like cases. This technique (2) has also a disadvantage that a part of the moving means is consumed in every moving operation and therefore the moving means should be reworked or exchanged after repeated movement of the object.

DISCLOSURE OF THE INVENTION

The inventors of the present invention completed the present invention after comprehensive investigation to solve the above problems.

The present invention provides a method of moving an object comprising a step of fixing the object to an object-moving means, a step of moving the object to a prescribed position by the object-moving means, and a step of releasing the object from the object-moving means;

wherein the step of fixing the object to the object-moving means comprises forming a deposit, for fixation of the object to the object-moving means kept close together, by applying a first corpuscular beam at a site for the fixation in a first gas to form a deposit from a substance constituting the first gas as a source material; and the step of releasing the object from the object-moving means comprises etching selectively the deposit by applying a second corpuscular beam to the position of the deposit in contact with a second gas capable of accelerating etching a main component of the deposit under application of the beam.

The present invention provides also a method of moving an object comprising a step of fixing the object to an object-moving means, a step of moving the object to a prescribed position by the object-moving means, and a step of releasing the object from the object-moving means; wherein the step of fixing the object to the object-moving means comprises forming a deposit, by irradiating with a first corpuscular beam a prescribed site for the fixation in a first gas in a state of holding the object to the object-moving means close together to form a deposit; and the step of releasing the object from the object-moving means comprises etching selectively the deposit by irradiating with a second corpuscular beam the prescribed position.

In the method of moving an object, the first gas and the second gas may be selected to cause selective etching of a main component of the deposit.

The present invention provides also an object-moving apparatus, comprising a means for fixing a movement object to an object-moving means, an object-moving means, and a means for releasing the movement object from the object-moving means;

wherein the means for fixing a movement object to an object-moving means comprises a means for holding the movement object and the object-moving means close together, and a means for forming a deposit a raw material of which is a principal component of a first gas by irradiating with a first corpuscular beam a site for the fixation in the first gas; and the means for releasing the movement object from the object-moving means comprises a means for irradiating with a second corpuscular beam a position of the deposit in a second gas. The first gas and the second gas may be selected to cause selective etching of a main component of the deposit in the second gas.

According to another aspect of the present invention, there is provided a process for production of a device using the method of moving an object, wherein the process comprises a step of preparing the movement object by working a part of the substrate.

The process may comprise a step of preparing the movement object by working a less adhesive substance film constituting a part of the substrate.

In the process, the working of a less adhesive substance film may be conducted by FIB irradiation.

In the process for production of a device, the process may comprise a step of preparing the movement object by working a film-shaped substance having a releasing layer and constituting a part of the substrate.

In the process, the working of a less adhesive substance film may be conducted by FIB irradiation.

The object-moving method and apparatus enables exact pick-up and release of a movement object by use of a deposit for the adhesion.

The object-moving method and apparatus enables selective etching of the deposit for adhesion, which prevents the damage of the moved object on the release from the moving means, or remaining of a residue of the object-moving means after the object release.

Further, the object-moving method and apparatus enables selective etching of the deposit for adhesion, which prevents the consumption of a part of the object-moving means in every moving operation, rendering unnecessary the reworking or exchange of the object-moving means after repeated movement of the object.

BEST MODES FOR CARRYING OUT THE INVENTION

An embodiment of the object-moving method of the present invention is explained below by reference to FIGS. 1 to 3 successively. The steps (a) to (c) below correspond respectively to FIG. 1, FIGS. 2A and 2B, and FIG. 3.

Figure 1:
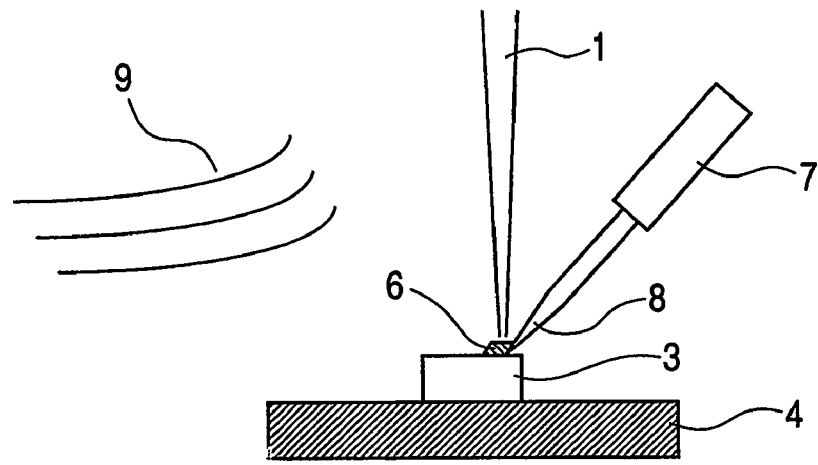
FIG. 1 illustrates an embodiment of the object-moving method of the present invention.
Figure 2A:
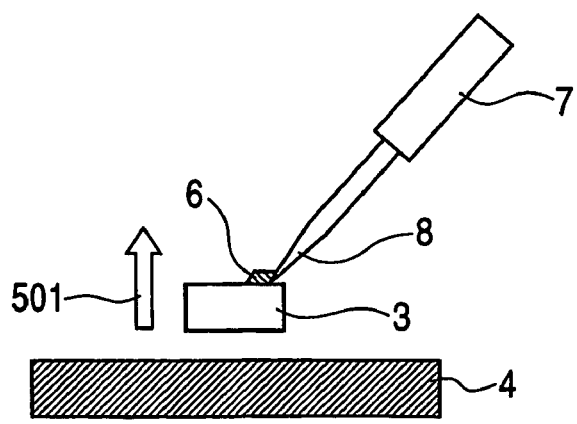
FIGS. 2A and 2B illustrate an example of the embodiment of the object-moving method of the present invention.
Figure 2B:
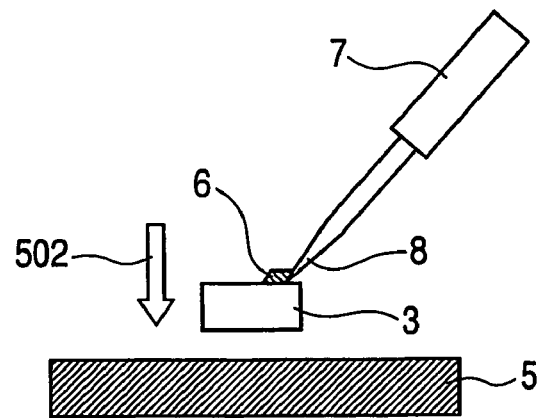
Figure 3:
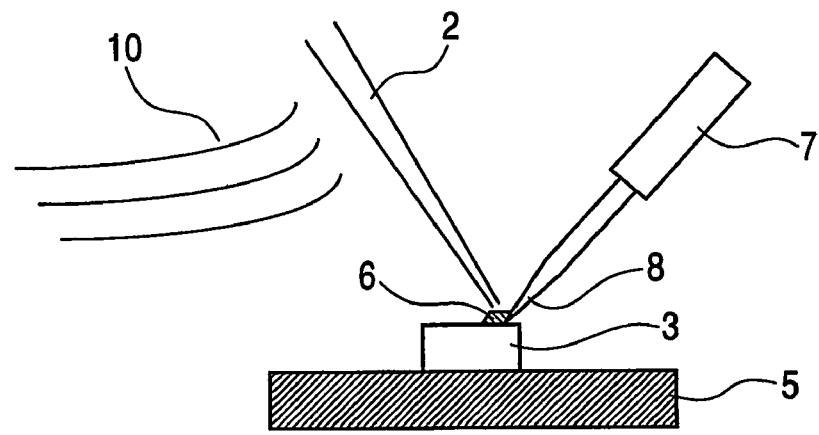
FIG. 3 illustrates an embodiment of the object-moving method of the present invention.

In FIGS. 1 to 3, the numerals denote the following: 1, a first corpuscular beam; 2, a second corpuscular beam; 3, a-movement object; 4, substrate-I; 5, substrate-II; 6, a deposit for adhesion; 7, an object-moving means; 8, an object-fixing portion of the object-moving means; 9, a first gas (deposit-forming gas); and 10, a second gas (etch-assisting gas). In FIGS. 2A and 2B, arrows 501 and 502 denote the direction of movement of the movement object.

In this embodiment, an object is moved from position-I on substrate-I to position-II on substrate-II by means of an object-moving means. Substrate-I and substrate-II may be one and the same or may be different. When substrate-I and substrate-II is one and the same, generally position-I and position-II are different from each other, but may be nearly the same. In the latter case, for example, the relative position (e.g., the direction) of the movement object is changed by the movement.

For smooth and exact movement of the object, in most cases, the state of the object and/or the substrate, and/or the object-moving means is preferably monitored in any one or more or all of the steps (a) to (c) of the object-moving method of the present invention.

(a) Step of Fixation of Object to Object-Moving Means:

Object-moving means 7 is brought close to movement object 3 at position-I on substrate-I 4. In this state, in an atmosphere of deposit-forming gas 9, first corpuscular beam 1 is projected to a prescribed position to form deposit 6 for fixation of movement object 3 to object-moving means 7.

The shape of the movement object in the present invention may be in any shape, such as a rectangular solid, a sphere, a round column, a spiral, and a gear. The surface state of the movement object is not limited to be flat, but may be curved, or may be rugged or stepped to some extent.

The material of the movement object of the present invention includes metals, ceramics, and organic matters. The constituting material of the movement object may be composed of a single substance, or combination of two or more substances.

The movement object (before the movement) of the present invention may be placed on the substrate in a fixed state or an unfixed state, or may be an object formed by working a part of the substrate. The example of the movement object formed by working a portion of the substrate include the aforementioned TEM specimens, less adhesive films forming a portion of a substrate, and worked products formed from a film-shaped material having a releasing layer. The method of formation of the movement object by working a portion of the substrate includes working by photolithography, working by electron beam lithography, and working by FIB irradiation. The working by FIB irradiation enables a series of the production process of formation, movement, assemblage, and so forth of the movement object to be conducted in one and the same apparatus. The movement object fixed to the substrate, or the movement object formed by working a portion of the substrate is separated from the substrate, as necessary, before or after the fixation of the movement object to the object-moving means. This separation of the movement object from the substrate may be conducted, for example, by irradiation of a corpuscular beam to the point of fixation of the movement object to the substrate for etching, by applying a force to the moving means for the separation, or by combination of these methods. In the case where the movement object is formed by working a film-shaped material having a releasing layer and constituting a portion of the substrate, a part of the releasing layer can remain on the substrate after separation by application of a force, or a part of the releasing layer can remain on the movement object; or a part of the releasing layer can remain on the substrate side and another part thereof can remain on the movement object. However, the remaining of the releasing layer is allowable provided that the remaining releasing layer does not retard the formation or selective etching of the deposit.

An example of the object-moving means of the present invention has, at least, a site for fixing the movement object by formation of a deposit (object-fixing position) and a driving mechanism for moving the movement object.

The constituting material of the movement means of the present invention includes metals, ceramics, and organic materials. The material of the moving means may be a simple material or a combination of two or more materials. In gas-assisted selective etching of the deposit, the object-fixing site and vicinity thereof of the object-moving means is preferably formed from a material resistant against the selective etching. For example, the main component of the deposit is preferably different from the main component of the object-fixing site and vicinity thereof of the object-moving means.

The gas species for deposit formation in this invention includes organometals such as $W(CO)_6$, $Mo(CO)_6$, $Ni(CO)_4$, $C_5H_5Pt(CH_3)_3$, and $Cu(hfac)_2$; organic compounds such as pyrene, styrene, and phenanthrene; silane compounds such as TEOS, and TMCTS; and metal fluorides such as $WF_6$. The deposit-forming gas may be used singly or in a mixture with another gas. For example, TEOS, TMCTS, or the like is used often as a mixture with $O_2$, $O_3$, or the like.

(b) Step of Movement of Object by Object-Moving Means:

Movement object 3 is moved by object-moving means 7 from position-I on substrate-I 4 to position-II on substrate-II 5.

The "movement" generally signifies carrying or transferring an object. In this Specification, in the movement, a movement object and an object-moving means having the movement object, fixed thereon are picked up together, and the object-moving means is moved together with the movement object.

The object-moving method of the present invention includes a process in which a movement object fixed to an object-moving means is picked up and the object-moving means is moved; a process in which a movement object fixed to an object-moving means is picked up together with an object-moving means and thereafter the substrate is moved; a process in which a movement object fixed to an object-moving means is picked up together with an object-moving means and thereafter the substrate is exchanged to another substrate; and combination of the processes.

The movement in the present invention includes any movement such as translational movement in an X direction, a Y direction, and a Z direction; and rotational movement around an axis; and combination thereof.

(c) Step of Release of Movement Object from Object-Moving Means:

The movement object 3 is released from the object-moving means 7 by selective etching of deposit 6 by irradiation of second corpuscular beam 2 in etch-assisting gas 10 at a prescribed site at position-II on substrate-II 5.

Regarding fixation state to the substrate after the movement in the present invention, the movement object may be unfixed or fixed to the substrate, or may be confined by the substrate but movable within a confined region.

The gas species for gas-assisted etching includes halogen-type gases such as $XeF_2$, $Cl_2$, $CCl_4$, $CHCl_3$, $CF_4$, $CHF_3$, $I_2$, and $Br_2$; and $H_2O$. The etch-assisting gas may be used singly or as a mixture with another gas.

The selection of the deposit-forming gas and the etch-assisting gas, and combination of the gases with the main component of the deposit are exemplified by (1) pyrene as the deposit-forming gas, $H_2O$ as the etch-assisting gas, and carbon as the main component of the deposit; (2) $W(CO)_6$ as the deposit-forming gas, $XeF_2$ as the etch-assisting gas, and tungsten as the main component of the deposit; and (3) TMCTS ($+O_2$) as the deposit-forming gas, $XeF_2$ as the etch-assisting gas, and silicon oxide as the main component of the deposit.

In the present invention, as described above, a first corpuscular beam is employed for the deposit formation, a second corpuscular beam is employed for the gas-assisted etching, and a third corpuscular beam is employed for the monitoring. The first, second, and third corpuscular beams may be the same; two of them may be the same with another one being different; or all of them may be different from each other.

Correspondingly, the corpuscular beam emission systems for the first, second, and third corpuscular beams may be constituted of identical units; two identical units and one different unit; or three different units. The corpuscular beam emission systems for the first, second, and third corpuscular beams may be constituted of a single unit or of plural units.

Therefore, the corpuscular beam emission system for the first, second, and third corpuscular beams may be constituted of one unit or plural units.

The method of irradiation with the corpuscular beam is exemplified by scanning irradiation with focused beam over a prescribed region, scanning irradiation with slightly diverged beam over a prescribed region, or combination thereof.

The corpuscular beam in the present invention is exemplified by ion beams, electron beams, and photon beams. The corpuscular beam may be employed singly or in combination of two or more kinds thereof. In use of the corpuscular beams in combination, the beams may be projected simultaneously, or in turn, or combination thereof.

For the ion beam as the corpuscular beam in the present invention, the ion species of the ion beam is exemplified by liquid metal ion sources such as Ga, Si, Ge, Cs, Nb, and Cu; and electric field ionization gas ion sources such as O, N, H, He, and Ar. For ease of handling, Ga is widely used as the ion species of the ion beam in practical operations.

Formation of the electron beam as the corpuscular beam in the present invention is exemplified by thermal electron emission, field emission, tunnel electron emission, and photoelectron emission.

For the photon beam as the corpuscular beam in the present invention, the kind of photon of the photon beam is exemplified by X-rays, ultraviolet rays, visible light rays, and infrared rays. For ease of handling, laser beams are widely used.

An embodiment of the object-moving apparatus of the present invention is described by reference to FIGS. 4 to 6. The description on (a) to (c) corresponds respectively to FIGS. 4 to 6.

The object-moving apparatus of the present invention is constituted at least of (a) a means for fixing a movement object to an object-moving means, (b) a functional unit for moving the movement object by driving the object-moving means, and (c) a means for releasing the movement object from the object-moving means.

The object-moving apparatus of the present invention has preferably at least a means for monitoring, by use of a third corpuscular beam, the state of the movement object, and/or a substrate and/or the object-moving means for conducting smoothly and surely the movement of the object.

This embodiment includes suitably the step of employing the means for monitoring the state of the movement object, the substrate, the object-moving means, a deposit, and so forth by projecting the third corpuscular beam and detecting the resulting signal, even when it is not specifically mentioned (explanation, illustration, etc.)

Figure 4:
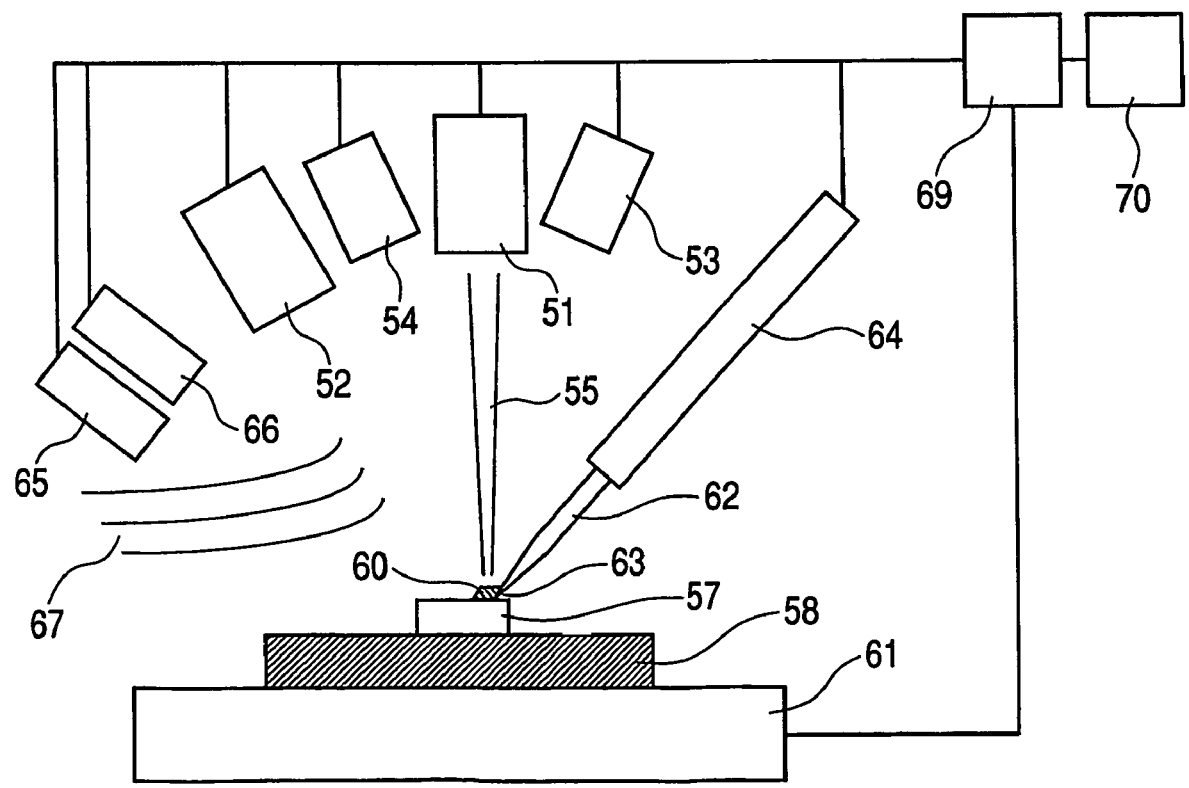
FIG. 4 illustrates an embodiment of the object-moving method of the present invention.
Figure 5A:
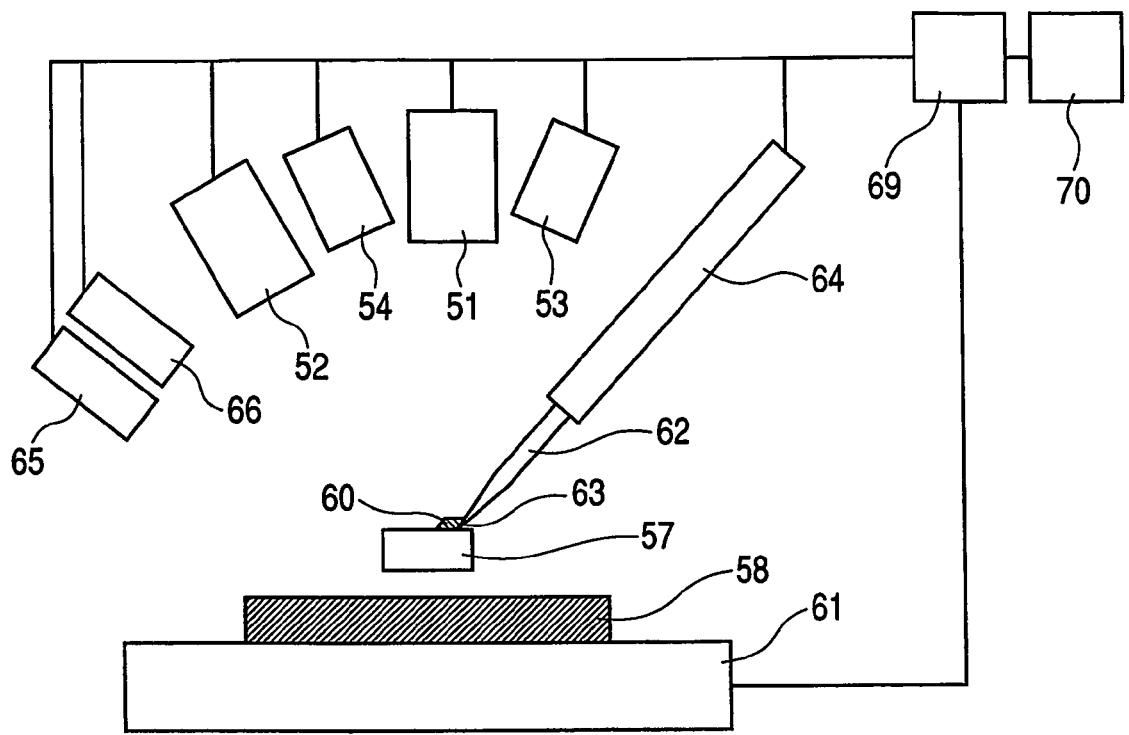
FIGS. 5A and 5B illustrate an embodiment of the object-moving method of the present invention.
Figure 5B:
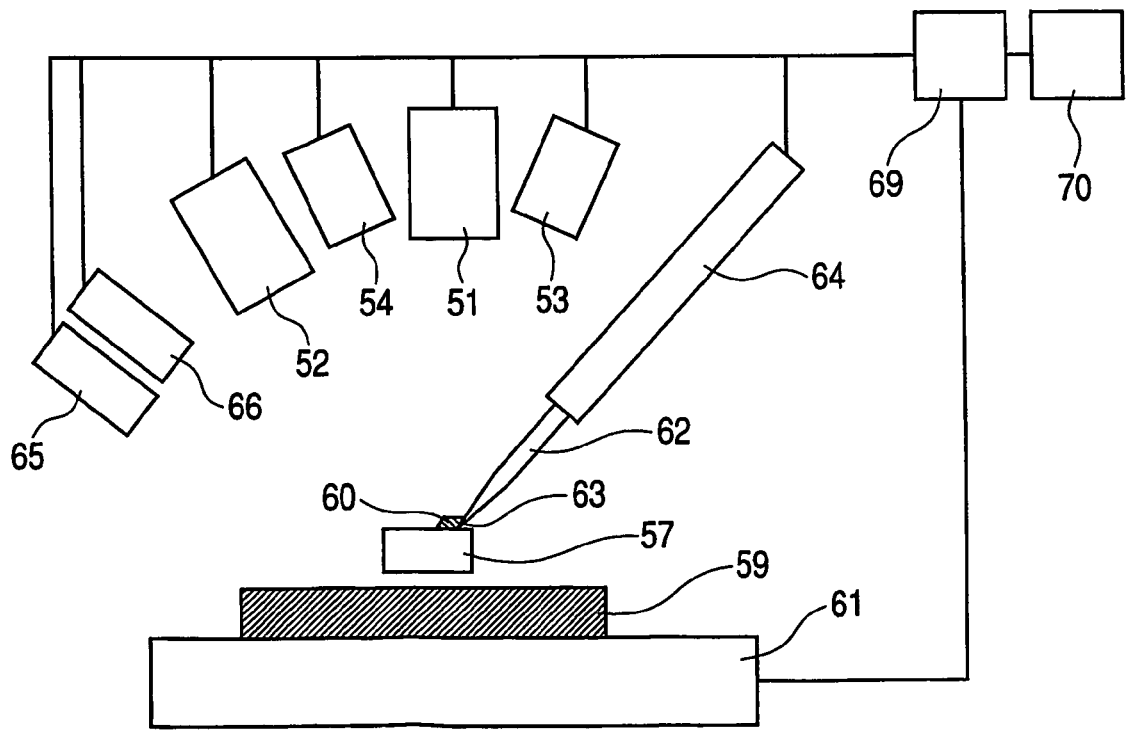
Figure 6:
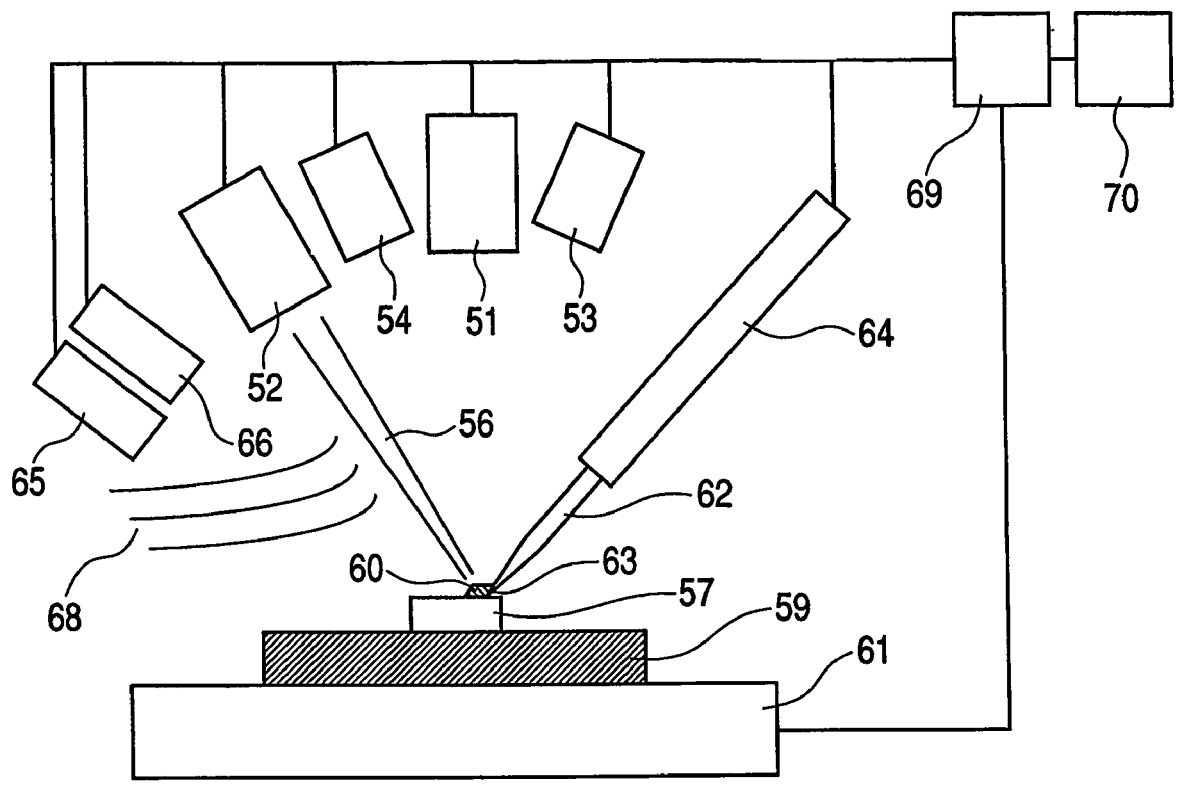
FIG. 6 illustrates an embodiment of the object-moving method of the present invention.

In FIGS. 4 to 6, the numerals denote the following: 51, a first corpuscular beam projection system; 52, a second corpuscular beam projection system; 53, a signal detection system for detecting a signal produced by irradiation with the first corpuscular beam; 54, a signal detection system for detecting a signal produced by irradiation with the second corpuscular beam; 55, a first corpuscular beam; 56, a second corpuscular beam; 57, a movement object; 58, a substrate-I; 59, a substrate-II; 60, a deposit for fixation; 61, a sample stage; 62, an object-moving means; 63, a fixation site on the object-moving means for fixing the movement object; 64, a driving unit for driving the object-moving means; 65, a gas introduction system for deposit formation; 66, a gas introduction system for gas-assisted etching; 67, a gas for deposit formation; 68, a etch-assisting gas; 69, a control system; and 70, a monitor display system. The above members are placed, as necessary, in a vacuum chamber (not shown in the drawings), and the chamber is evacuated by an evacuation system (not shown in the drawings). The control system 69 controls and drives the object-moving apparatus by transmitting and receiving signals to or from the following members: first corpuscular beam projection system 51;

second corpuscular beam projection system 52; signal detection system 53 for detecting a signal produced by irradiation with the first corpuscular beam; signal detection system 54 for detecting a signal produced by irradiation with the second corpuscular beam; sample stage 61; object-moving means 62; driving unit 64 for driving the object-moving means; gas introduction system 65 for deposit formation; gas introduction system 66 for gas-assisted etching; and monitor display system 70, and a vacuum control system (not shown in the drawings).

First corpuscular beam 55 is projected by control of irradiation system 51: the irradiated site with the first corpuscular beam 55 can be confirmed by detecting the signal produced by the irradiation by detection system 53 with monitor display system 70. Similarly, second corpuscular beam 56 is projected by control of irradiation system 52, and the irradiated position with the second corpuscular beam 56 can be confirmed by detecting the signal produced by the irradiation by detection system 54 with monitor display system 70.

Sample stage 61 supports movement object 57, substrate-I 58, substrate-II 59, and so forth. By controlling the movement of sample stage 61, movement object 57, substrate-I 58, and substrate-II 59 are moved together with sample stage 61.

Object-moving means 62 has at least fixation site 63 for fixing an object and driving unit 64 for driving object-moving means. The movement object is moved by control of driving unit 64 of the object-moving means.

Deposit-forming gas 67 is introduced by control of deposit-forming gas-introduction system 65. With introduction of the deposit-forming gas 67, deposit 60 is formed at a prescribed position by projecting first corpuscular beam 35 to the prescribed position (FIG. 4).

Similarly, etch-assisting gas 68 is introduced by control of deposit-forming gas-introduction system 66. With introduction of etch-assisting gas 68, deposit 60 at the prescribe position is selectively etched by projection of second corpuscular beam 56 to the prescribed position (the aforementioned position of formation of the deposit 60) (FIG. 6).

Next, a means (a) for fixing a movement object to an object-moving means, a functional unit (b) for moving the movement object by driving the object-moving means, and a means (c) for releasing the movement object from the object-moving means are explained successively.

(a) Means for Fixation of Movement Object to Object-Moving Means:

The means for fixing a movement object to an object-moving means comprises a means for forming a deposit for adhesion of a movement object to an object-moving means by projecting a first corpuscular beam to a prescribed position with the movement object kept close to the object-moving means in a deposit-forming gas atmosphere.

This is explained below in detail by reference to FIG. 4. Substrate-I 58 and movement object 57 are held on sample stage 61. Object-moving means 62 is brought close to movement object 57 at position-I of substrate-I 58 by control of driving unit 64 of the object-moving means 62. Then, deposit-forming gas 67 is introduced thereto by control of deposit-forming gas introduction system 65. In this state, first corpuscular beam 55 is projected to a prescribed position (the vicinity to a portion of movement object 57 and object fixation position 53 of object-moving means) by control of irradiation system 51 to form deposit 60 for adhesion of movement object 57 to object-moving means 62.

The shape of the movement object in the present invention is exemplified by a rectangular solid, a sphere, a round column, a spiral, and a gear. The surface state of the moved object is not limited to be planar, but may be curved, or may be rugged or stepped to some extent.

The material of the movement object of the present invention includes metals, ceramics, and organic materials. The material of the movement object may be composed of a single substance, or combination of two or more substances.

The movement object (before the movement) in the present invention may be placed on the substrate in an unfixed state, or in a fixed state, or may be an object formed by working a part of the substrate. Of these, the object formed by partial working of the substrate includes TEM specimens, and the like. The movement object fixed to the substrate, or formed by partial working of the substrate needs to be separated from the substrate, as necessary, for movement before or after the fixation of the movement object to the object-moving means. The method of separation of the movement object from the substrate includes etching of the fixation portion by projection of a corpuscular beam, application of force, or combination thereof.

The object-moving means of the present invention may be the ones which have at least a position for fixing the movement object (object fixation position) by formation of a deposit and have a driving mechanism for the movement, but are not limited, provided that it does not cause inconvenience in the movement of the movement object, deposit formation, selective etching, and so forth.

The material of the object-moving means of the present invention includes metals, ceramics, and organic materials. The material of the movement object may be composed of a single substance, or combination of two or more substances. Preferably, a material which is resistant to etching in the gas-assisted etching of the deposit is selected as the material at or around the object-fixation site. For example, the main component near the object fixation site of the object-moving means is preferably different from the main component of the deposit.

The gas species for deposit formation in the present invention includes organometals such as $W(CO)_6$, $Mo(CO)_6$, $Ni(CO)_4$, $C_5H_5Pt(CH_3)_3$, and $Cu(hfac)_2$; organic compounds such as pyrene, styrene, and phenanthrene; silanes such as TEOS, and TMCTS; and metal fluorides such as $WF_6$. The deposit-forming gas may be used singly or in a mixture with another gas. For example, TEOS, TMCTS or the like is used often as a mixture with $O_2$, $O_3$ or the like.

(b) Functional Unit for Movement of Movement Object by Use of Object-Moving Means:

The functional unit for movement of the movement object by use of the object-moving means includes a functional unit for moving a movement object by use of the object-moving means from position-I on substrate-I to position-II on substrate-II.

This is explained below in detail by reference to FIGS. 5A and 5B. Movement object 57 is moved (transferred) from position-I of substrate-I 58 on sample stage 61 to position-II of substrate-II 59 on stage 61 by control of driving unit 64 of driving means 62 and sample stage 61.

The term "movement" generally denotes an action or process of carrying or transferring an object. In this Specification, in the step of movement, the movement object fixed to the object-moving means is picked up together with the object-moving means and is moved.

The object-moving method of the present invention includes a process in which a movement object fixed to an object-moving means is picked up and the object-moving means is moved; a process in which a movement object fixed to an object-moving means is picked up together with an object-moving means and thereafter the substrate is moved; a process in which a movement object fixed to an object-moving means is picked up together with an object-moving means and thereafter the substrate is exchanged to another substrate; and combination of the processes.

The movement in the present invention includes any movement such as translational movement in an X direction, a Y direction, and a Z direction; and rotational movement around an axis; and combination thereof.

(c) Means for Release of Movement Object from Object-Moving Means:

The means for releasing the movement object from the object-moving means comprises a means for etching selectively the aforementioned deposit for adhesion by projecting a second corpuscular beam to a prescribed position in an etch-assisting gas.

This means is explained below in detail by reference to FIG. 6. Movement object 57 placed on position-II of substrate-II 59 on sample stage 61, and object-moving means 62 are irradiated with second corpuscular beam 56 at a prescribed position (position where deposit 60 has been formed for adhesion) with introduction of etch-assisting gas 68 by control of etch-assisting gas introduction system 66. Thereby, deposit 60 for the adhesion is selectively etched to separate movement object 57 from object-moving means 62.

Regarding the state of fixation to the substrate, the movement object (after the movement) in the present invention may be fixed, unfixed, or may be confined to the substrate but movable within the confined region.

The gas species for gas-assisted etching includes halogen-type gases such as $XeF_2$, $Cl_2$, $CCl_4$, $CHCl_3$, $CF_4$, $CHF_3$, $I_2$, and $Br_2$; and $H_2O$. The etch-assisting gas may be used singly or as a mixture with another gas.

The selection of the deposit-forming gas and the etch-assisting gas, and combination of the gases with the main component of the deposit are exemplified by (1) pyrene as the deposit-forming gas, $H_2O$ as the etch-assisting gas, and carbon as the main component of the deposit; (2) $W(CO)_6$ as the deposit-forming gas, $XeF_2$ as the etch-assisting gas, and tungsten as the main component of the deposit; and (3) TMCTS ($+O_2$) as the deposit-forming gas, $XeF_2$ as the etch-assisting gas, and silicon oxide as the main component of the deposit.

In the present invention, as described above, a first corpuscular beam is employed for the deposit formation, a second corpuscular beam is employed for the gas-assisted etching, and a third corpuscular beam is employed for the monitoring. The first, second, and third corpuscular beams may be the same; two of them may be the same with another one being different; or all of them may be different from each other.

Correspondingly, the corpuscular beam emission systems for the first, second, and third corpuscular beams may be constituted of identical units; two identical units and one different unit; or three different units. The corpuscular beam emission systems for the first, second, and third corpuscular beams may be constituted of a single unit or of plural units.

The irradiation with the corpuscular beam may be conducted by irradiation scanning with a focused beam over a prescribed region, irradiation scanning with slightly diverged beam over a prescribed region, or combination thereof.

The corpuscular beam in the present invention is exemplified by ion beams, electron beams, and photon beams. The corpuscular beam may be employed singly or in combination of two or more kinds thereof. In use of the corpuscular beams in combination, the beams may be projected simultaneously, or in turn, or combination thereof.

For the ion beam as the corpuscular beam in the present invention, the ion species of the ion beam is exemplified by liquid metal ion sources such as Ga, Si, Ge, Cs, Nb, and Cu; and electric field ionization gas ion sources such as O, N, H, He, and Ar. For ease of handling, Ga is widely used as the ion species of the ion beam in practical operations.

Formation of the electron beam as the corpuscular beam in the present invention is exemplified by thermal electron emission, field emission, tunnel electron emission, and photoelectron emission.

For the photon beam as the corpuscular beam in the present invention, the kind of the photon of the photon beam is exemplified by X-rays, ultraviolet rays, visible light rays, and infrared rays. For ease of handling, laser beams are widely used.

EXAMPLES

The present invention is described below in more detail by reference to Examples Example 1

In this Example, a gear-shaped part is moved to a shaft by the object-moving method of the present invention. This method of movement is explained by reference to FIGS. 7 to 15.

In FIGS. 7 to 15, the numerals denote the followings: 11, an electron beam as a first corpuscular beam; 12, an ion beam as a second corpuscular beam; 13, a gear-shaped part as a movement object; 14, substrate-I; 15, substrate-II; 16, a deposit for adhesion (containing carbon as the main constituent); 17, a moving means; 18, a tungsten needle as a portion of the object-moving means for fixing the object; 19, a pyrene gas as a deposit-forming gas; 20, an $H_2O$ gas as a etch-assisting gas; 21, a fixing bar for fixing the gear-shaped part to substrate-I; 22, a shaft; 23, a driving mechanism of the driving means; and 24, a hole of the gear-shaped part.

This Example includes suitably steps of monitoring the states of the movement object, substrate, moving means, deposit, and so forth by detection of secondary electrons produced by electron beam scanning (SEM: scanning electron microscopy), although not mentioned specifically.

Figure 7:
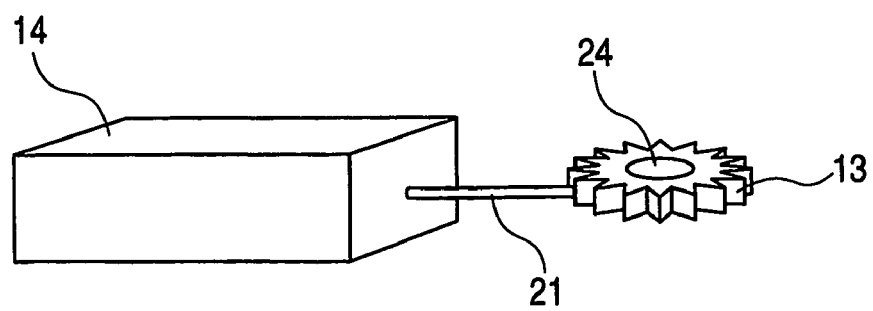
FIG. 7 illustrates an example of the object-moving method (movement of a gear-shaped part to a shaft) of the present invention.

(a) Step of Fixation of Movement Object to Object-Moving Means:

As shown in FIG. 7, gear-shaped part 13 is prepared as a movement object. This gear-shaped part 13 is fixed through fixing bar 21 to substrate-I 14.

Figure 8:
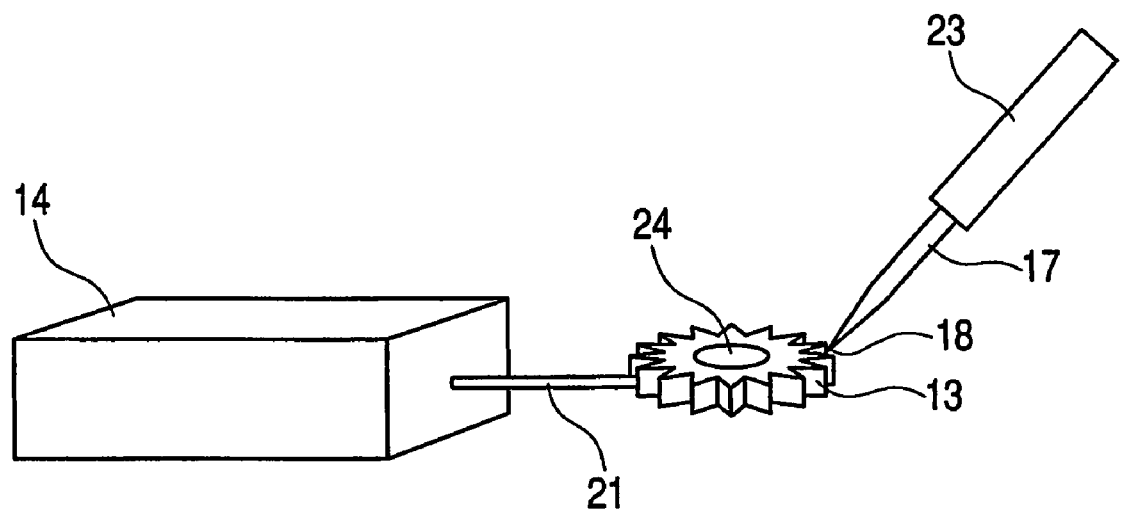
FIG. 8 illustrates an example of the object-moving method (movement of a gear-shaped part to a shaft) of the present invention.

As shown in FIG. 8, object-moving means 17 is brought close to gear-shaped part 13. This object-moving means 17 is constituted of tungsten needle 18, driving mechanism 23, and so forth: the movement object is fixed to or around the tip of the tungsten needle.

Figure 9:
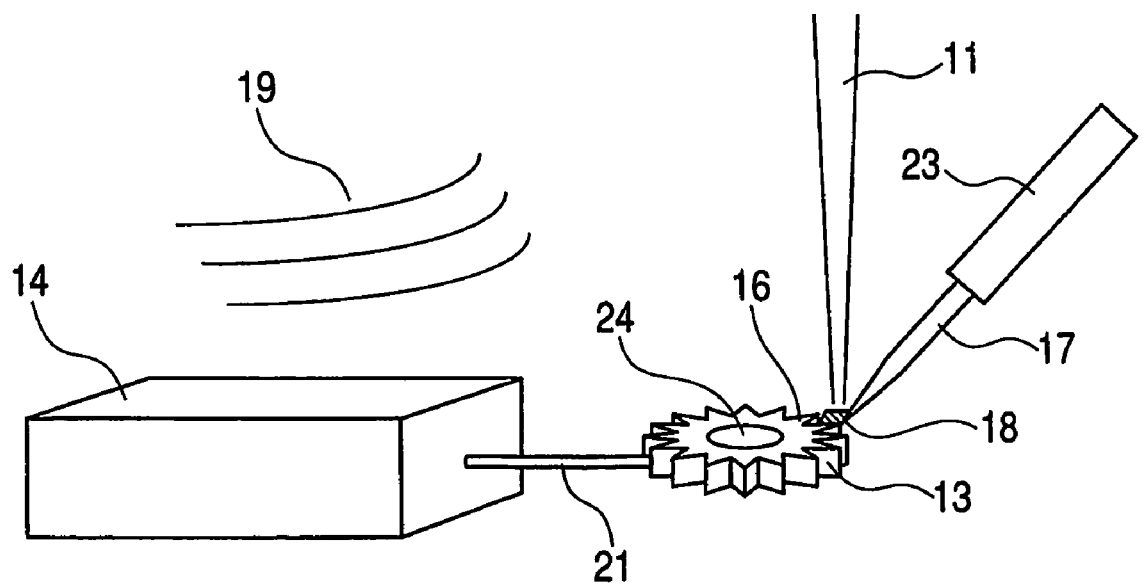
FIG. 9 illustrates an example of the object-moving method (movement of a gear-shaped part to a shaft) of the present invention.

As shown in FIG. 9, object-moving means 17 is brought close to gear-shaped part 13. In this state, deposit 16 (containing carbon as the main component) for adhesion of gear-shaped part 13 with tungsten needle 18 is formed by projection of electron beam 11 to a prescribed portion in pyrene gas 19.

Figure 10:
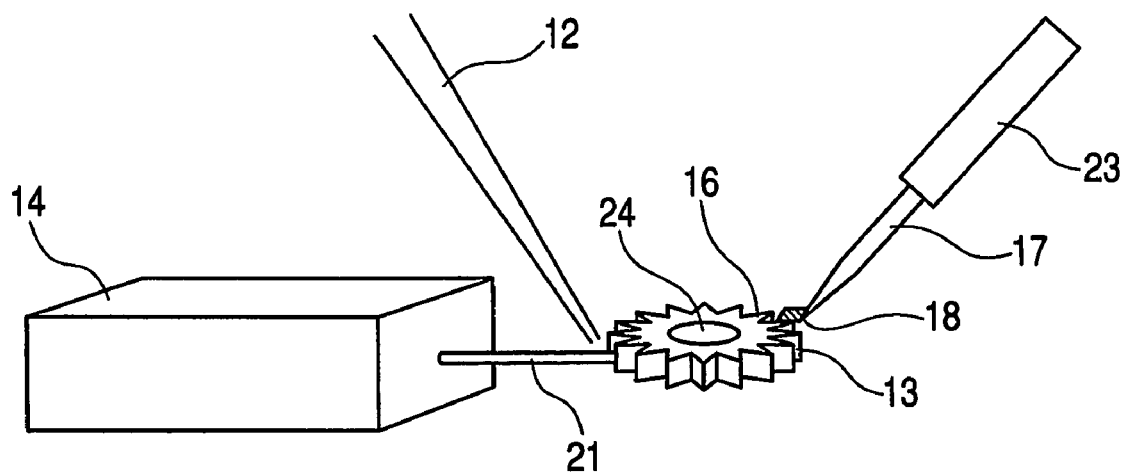
FIG. 10 illustrates an example of the object-moving method (movement of a gear-shaped part to a shaft) of the present invention.

Then as shown in FIG. 10, gear-shaped part 13 is separated from substrate-I 14 by projecting ion beam 12 to fixation bar 21 fixing the gear-shaped part 13 to substrate-I 14 to etch the bar.

Figure 11:
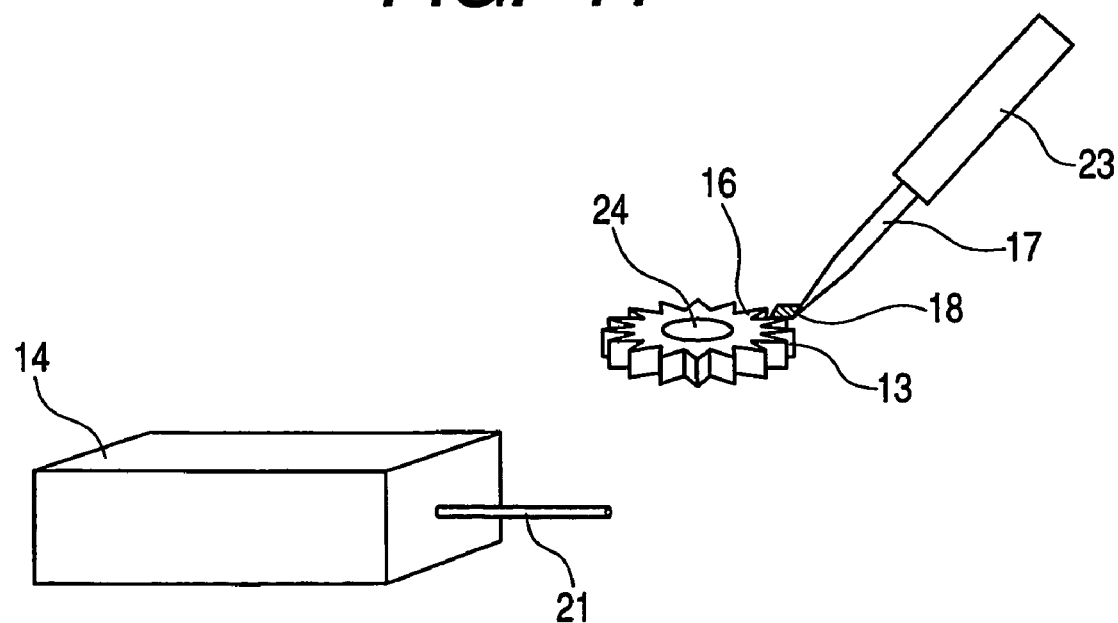
FIG. 11 illustrates an example of the object-moving method (movement of a gear-shaped part to a shaft) of the present invention.

(b) Step of Movement of Object by Object-Moving Means:

As shown in FIG. 11, object-moving means 17 is picked up together with gear-shaped part 13 fixed thereto.

Figure 12:
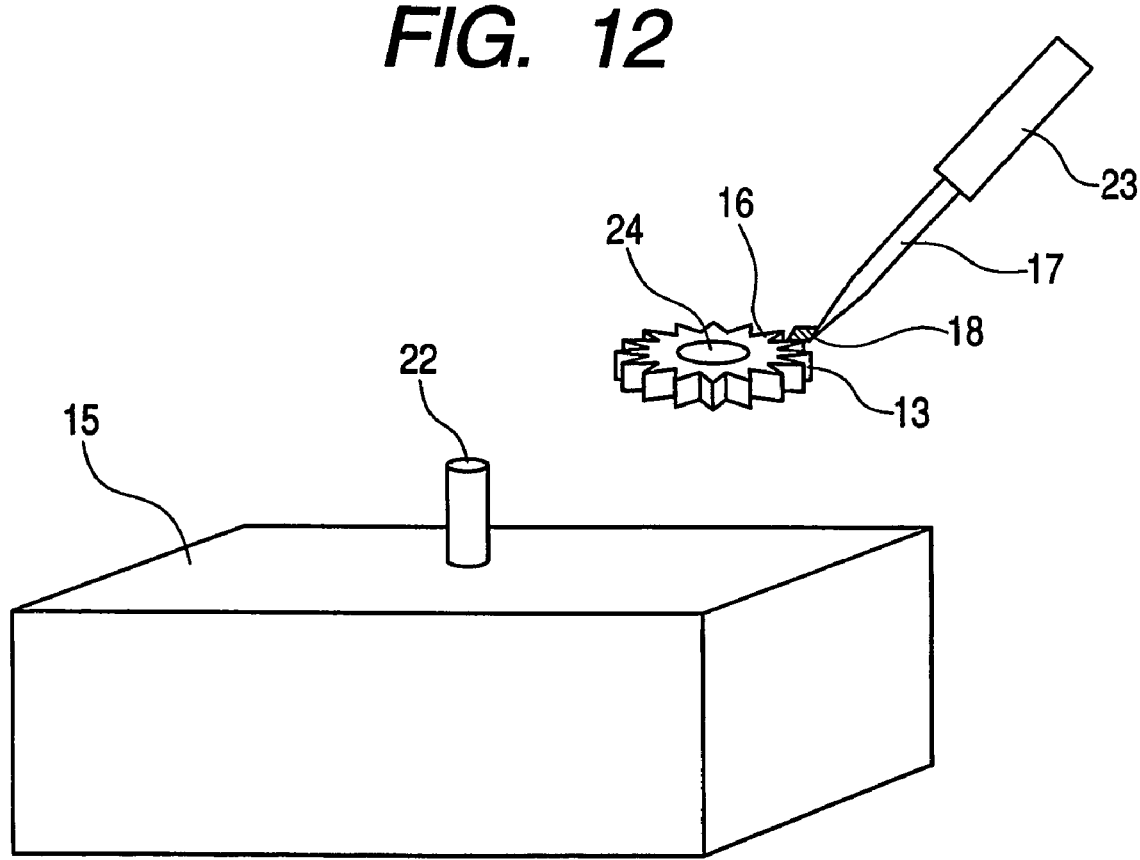
FIG. 12 illustrates an example of the object-moving method (movement of a gear-shaped part to a shaft) of the present invention.

As shown in FIG. 12, substrate-I 14 after separation of gear-shaped part 13 is replaced by substrate-II 15 having shaft 22.

Figure 13:
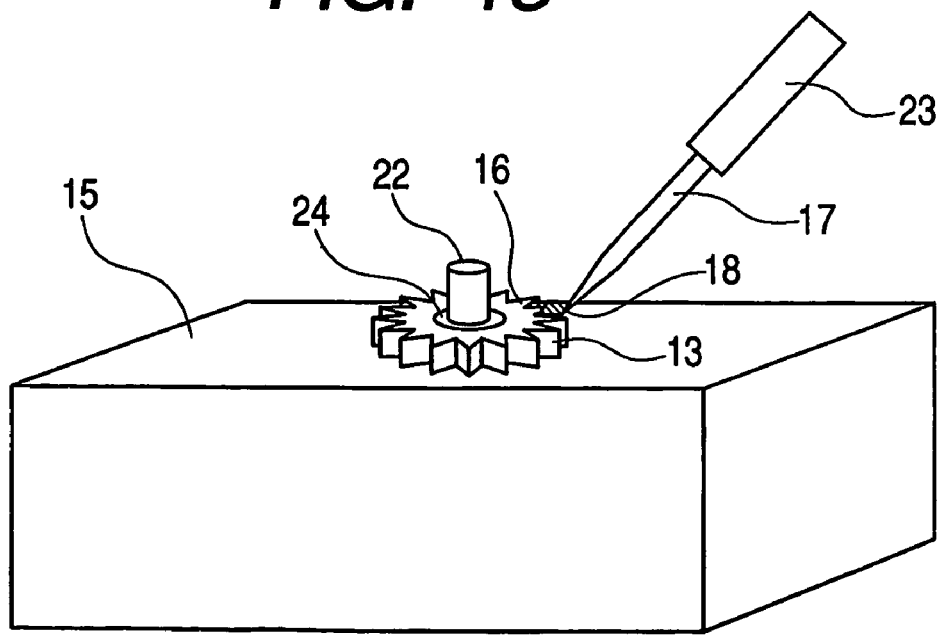
FIG. 13 illustrates an example of the object-moving method (movement of a gear-shaped part to a shaft) of the present invention.

As shown in FIG. 13, object-moving means 17 carrying gear-shaped part 13 is moved, and hole 24 of the gear-shaped part is allowed to fit on shaft 22 on substrate II 15.

Figure 14:
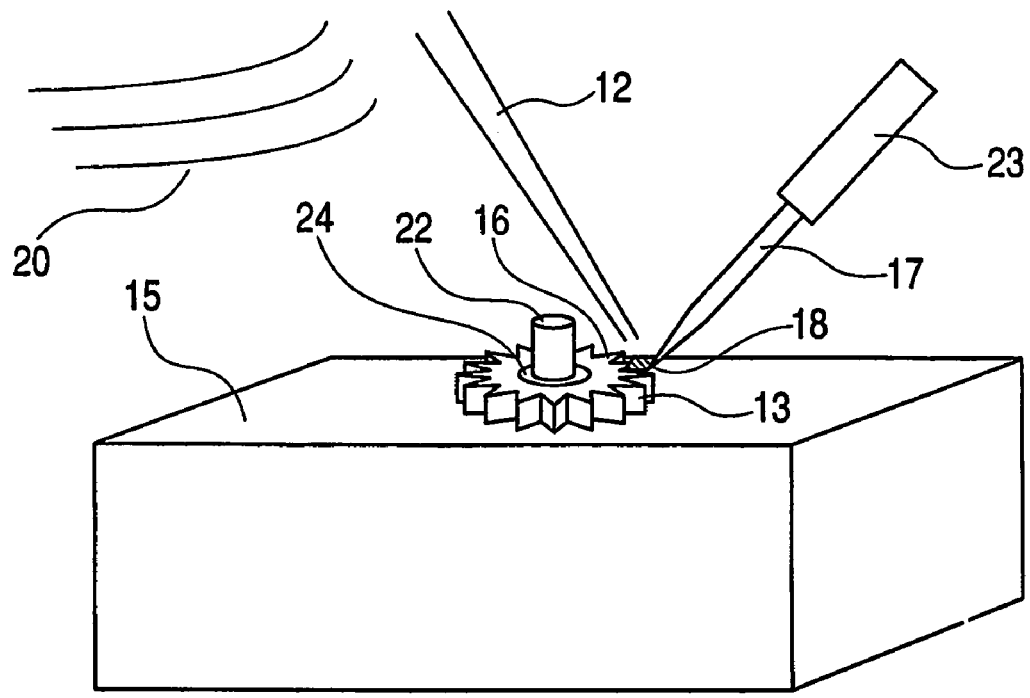
FIG. 14 illustrates an example of the object-moving method (movement of a gear-shaped part to a shaft) of the present invention.

(c) Step of Separation of Movement Object from Object-Moving Means:

As shown in FIG. 14, deposit 16 for the adhesion is selectively etched by projecting ion beam 12 in $H_2O$ gas 20 to a prescribed position (point of formation of deposit 16 for adhesion of gear-shaped part 13 to object-moving means 17). Thereby gear-shaped part 13 is released from object-moving means 17.

Figure 15:
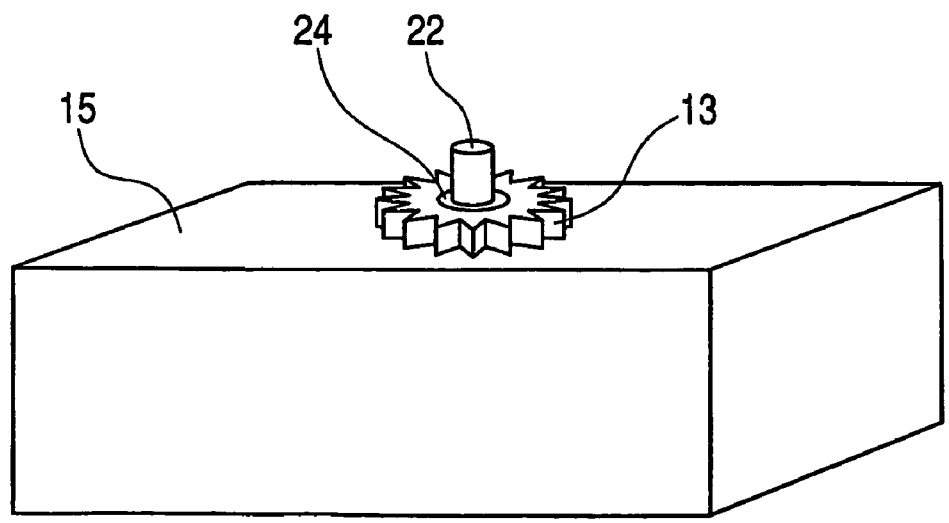
FIG. 15 illustrates an example of the object-moving method (movement of a gear-shaped part to a shaft) of the present invention.

As shown in FIG. 15, the object-moving means is taken away.

As shown in FIGS. 7 to 15, a gear-shaped part is transferred to the shaft surely by the object-moving method of the present invention.

Evaluation

The moved object (gear-shaped part) after the movement is observed by SEM and found that the damage of the gear-shaped part is little and that a residue of the object-moving means (tip portion of the needle) is not found on the gear-shaped part. On the other hand, the tip of the needle (object fixation point) is observed and found that the loss of the tip of the needle has been prevented.

Example 2

Movement of a TEM specimen to an FIB-TEM observation mesh by the object moving method of the present invention is exemplified by reference to FIGS. 16 to 25.

In FIGS. 16 to 25, the numerals denote the following: 31, an ion beam serving as the first and second corpuscular beams; 33, a TEM specimen as the movement object; 34, substrate-I; 35, an FIB-TEM observation mesh as substrate-II; 36 a deposit (containing carbon as the main component) for adhesion; 37, an object-moving means; 38, a tungsten needle for object picking-up as the object-moving means; 39, a pyrene gas as the deposit-forming gas; 40, an $H_2O$ gas as the etch-assisting gas; 41, a fixing portion for fixing the TEM specimen to substrate-I, 42, a deposit (containing carbon as the main component) for adhesion of TEM specimen to the FIB-TEM observation mesh; and 43, a driving mechanism for the object-moving means.

This Example includes suitably steps of monitoring of the states of the movement object, substrate, moving means, deposit, and the like by detection of secondary electrons produced on ion beam scanning (SIM: scanning ion microscopy), although it is not mentioned specifically. In the above observation, the dose of the ion beam is minimized.

Figure 16:
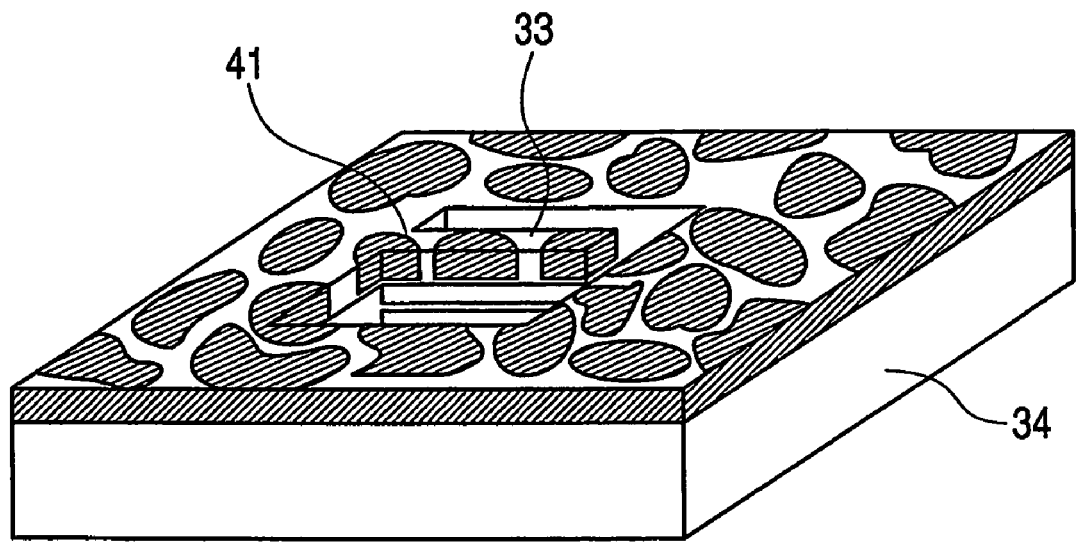
FIG. 16 illustrates an example of the object-moving method (transfer of a TEM observation specimen onto an FIB-TEM observation mesh) of the present invention.

(a) Step of Fixation of Object to Object-Moving Means:

As shown in FIG. 16, TEM specimen 33 is prepared as the movement object. This TEM specimen 33 is formed by FIB-working on substrate-I 34, and is fixed through fixation portion 41 to substrate-I 34.

Figure 17:
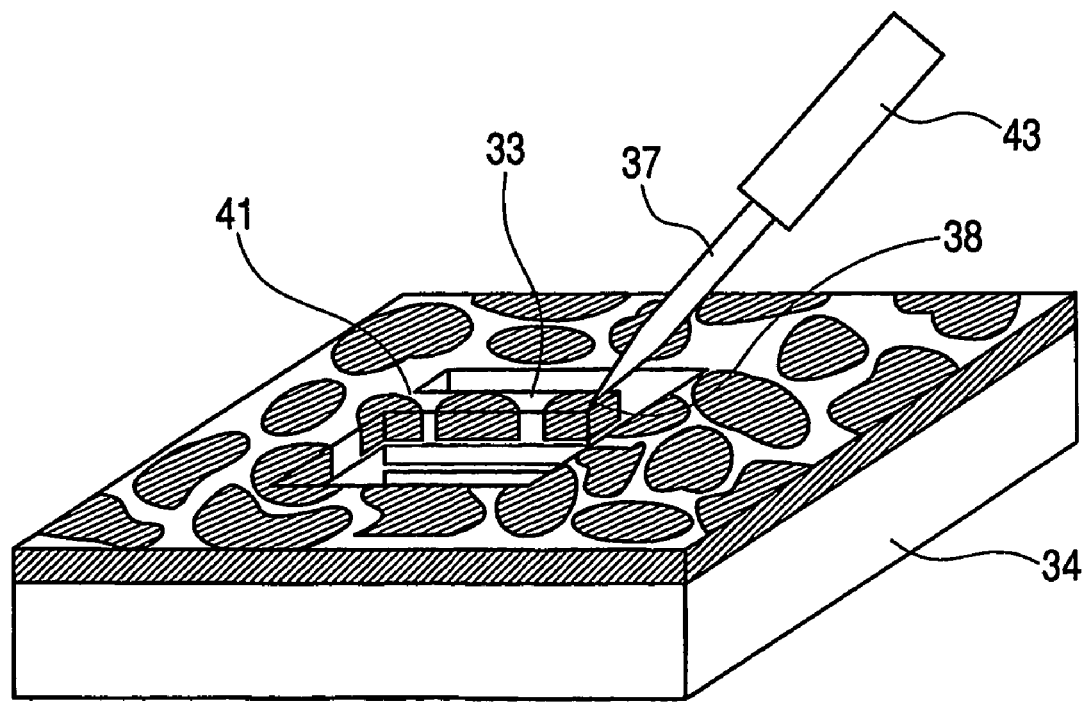
FIG. 17 illustrates an example of the object-moving method (transfer of a TEM observation specimen onto an FIB-TEM observation mesh) of the present invention.

As shown in FIG. 17, object-moving means 37 is brought close to TEM specimen 33. This object-moving means 37 is constituted of tungsten needle 38 and driving mechanism 43: the movement object is fixed to or around the tip of the tungsten needle.

Figure 18:
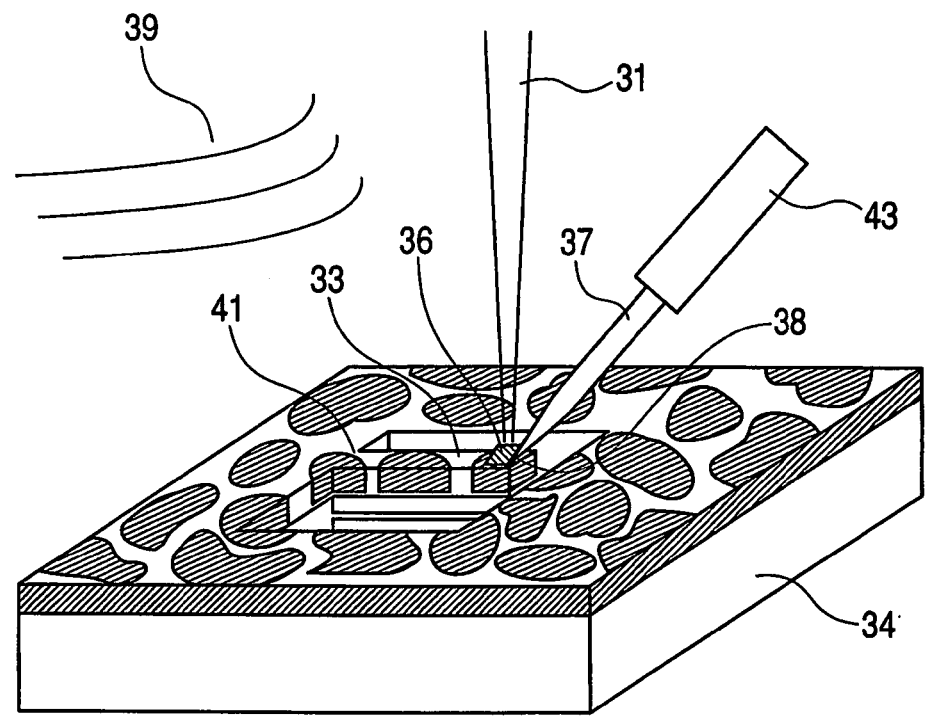
FIG. 18 illustrates an example of the object-moving method (transfer of a TEM observation specimen onto an FIB-TEM observation mesh) of the present invention.

As shown in FIG. 18, object-moving means 37 is brought close to TEM specimen 33. In this state, deposit 36 (containing carbon as the main component) for adhesion of TEM specimen 33 to object-moving means 37 is formed by projection of ion beam 31 to a prescribed site in pyrene gas 39.

Figure 19:
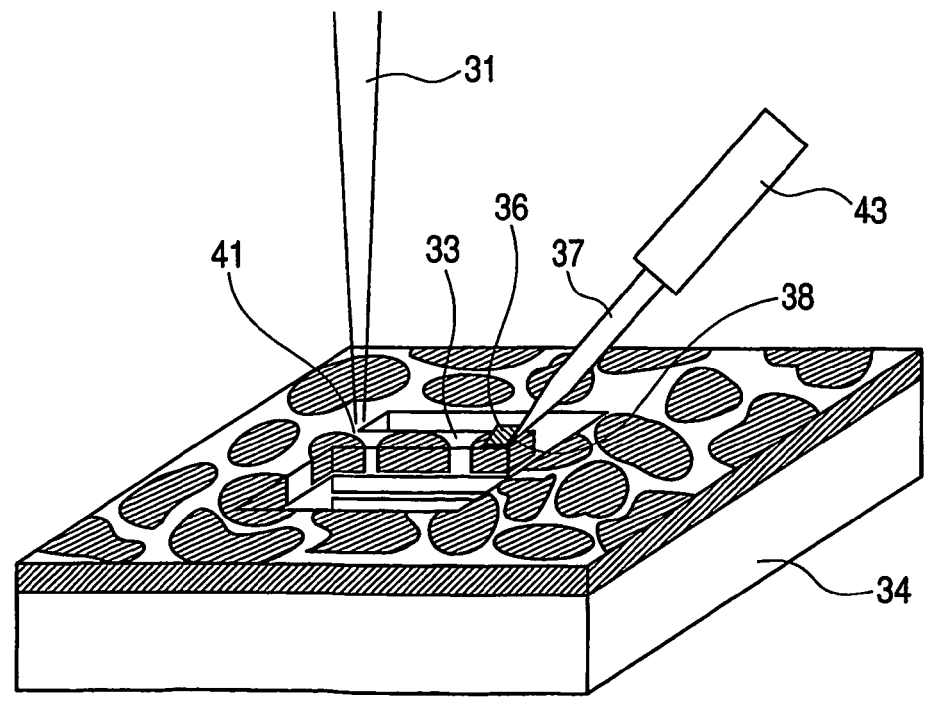
FIG. 19 illustrates an example of the object-moving method (transfer of a TEM observation specimen onto an FIB-TEM observation mesh) of the present invention.

Then as shown in FIG. 19, TEM specimen 33 is separated from substrate-I 34 by projecting ion beam 31 for etching to fixation portion 41 fixing the TEM specimen 33 to substrate-I 34.

Figure 20:
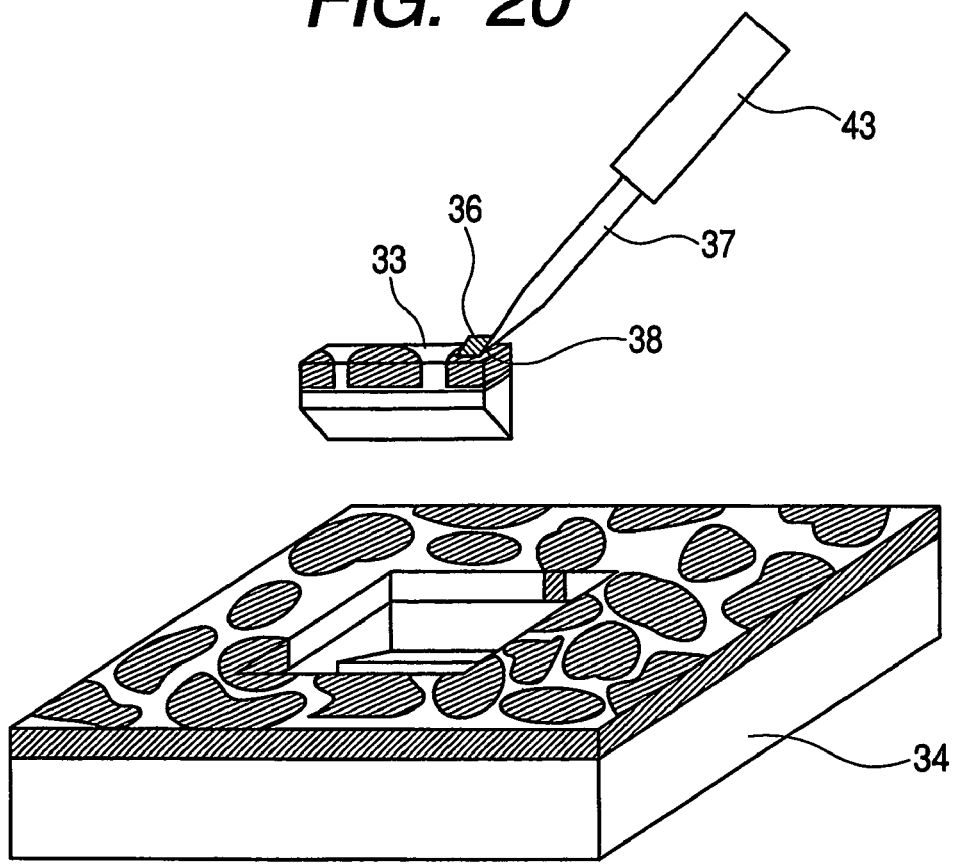
FIG. 20 illustrates an example of the object-moving method (transfer of a TEM observation specimen onto an FIB-TEM observation mesh) of the present invention.

(b) Step of Movement of Object by Object-Moving Means:

As shown in FIG. 20, object-moving means 37 is picked up together with TEM specimen 33 fixed thereto.

Figure 21:
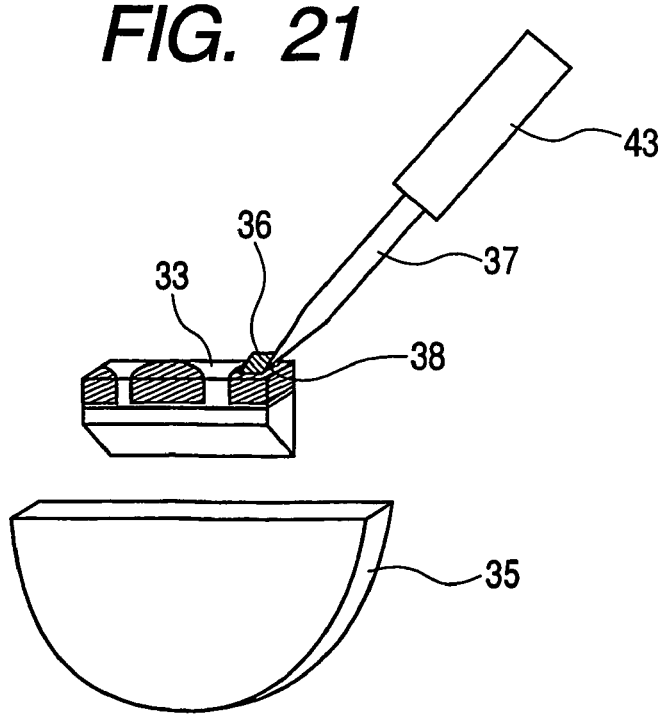
FIG. 21 illustrates an example of the object-moving method (transfer of a TEM observation specimen onto an FIB-TEM observation mesh) of the present invention.

As shown in FIG. 21, substrate-I 34 after separation of TEM specimen 33 is replaced by FIB-TEM observation mesh 35.

Figure 22:
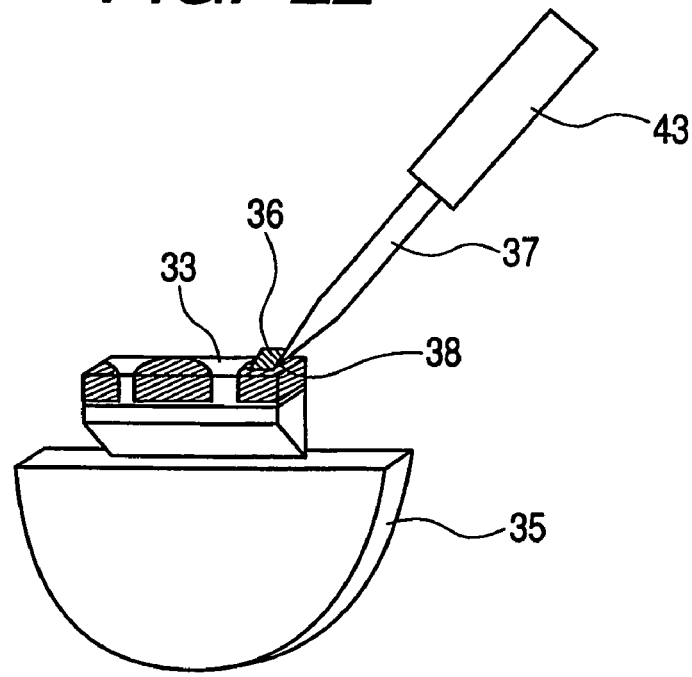
FIG. 22 illustrates an example of the object-moving method (transfer of a TEM observation specimen onto an FIB-TEM observation mesh) of the present invention.

As shown in FIG. 22, object-moving means carrying TEM specimen 33 is brought close to FIB-TEM observation mesh 35 by driving object-moving means 37.

Figure 23:
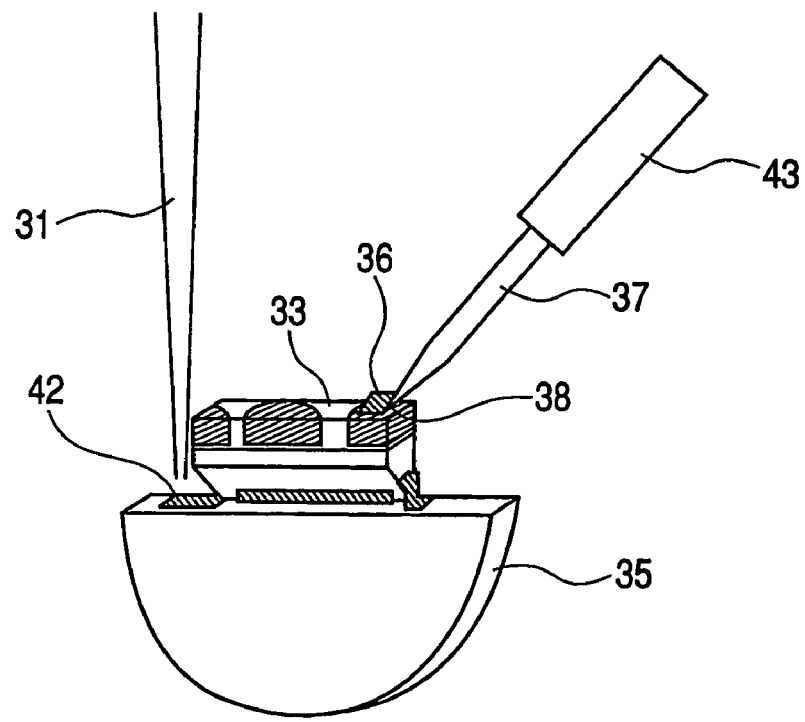
FIG. 23 illustrates an example of the object-moving method (transfer of a TEM observation specimen onto an FIB-TEM observation mesh) of the present invention.

As shown in FIG. 23, in the state of TEM specimen 33 kept close to FIB-TEM observation mesh 35, ion beam 31 is projected to a prescribed portion in a pyrene gas 39 to form deposit 42 for adhesion of TEM specimen 33 to FIB-TEM observation mesh 35.

Figure 24:
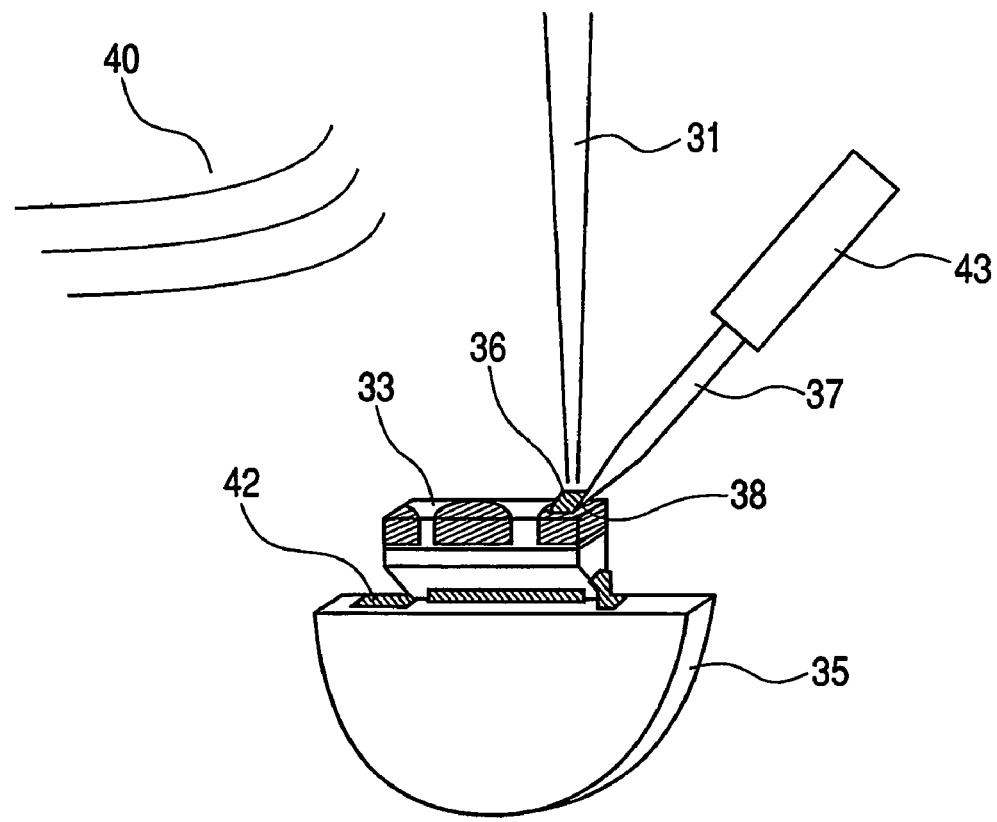
FIG. 24 illustrates an example of the object-moving method (transfer of a TEM observation specimen onto an FIB-TEM observation mesh) of the present invention.

(c) Step of Separation of Movement Object from Object-Moving Means:

As shown in FIG. 24, deposit 36 (containing carbon as the main component) for the adhesion is selectively etched by projection of ion beam 31 in $H_2O$ gas 40 to a prescribed position (position of formed deposit 36 for adhesion of TEM specimen 33 to object-moving means 37). Thereby TEM specimen 33 is released from object-moving means 37.

Figure 25:
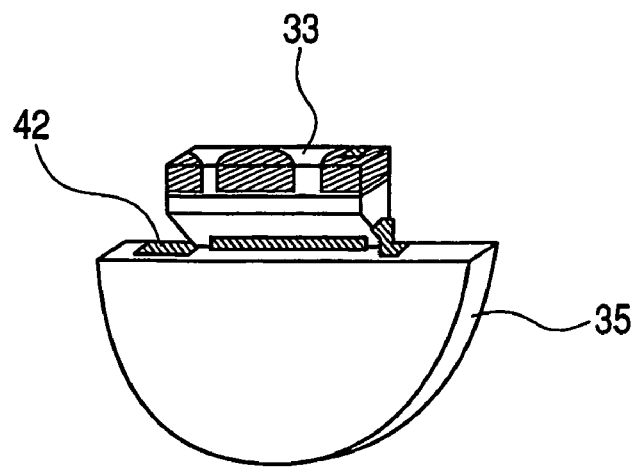
FIG. 25 illustrates an example of the object-moving method (transfer of a TEM observation specimen onto an FIB-TEM observation mesh) of the present invention.

As shown in FIG. 25, the object-moving means 37 is taken away from TEM specimen 33.

Evaluation

As shown in FIGS. 16 to 25, a TEM specimen is moved onto an FIB-TEM observation mesh surely by the object-moving method of the present invention. The moved object (TEM specimen) after the movement is observed by SEM and found that the damage of the TEM specimen is little and a residue of the object-moving means (tip portion of the needle) is not found on the gear-shaped part. On the other hand, the tip of the needle (object fixation point) is observed and found that the loss of the tip of the needle has been prevented.

Example 3

An object-moving apparatus of the present invention is explained by reference to FIGS. 26 to 28.

Figure 26:
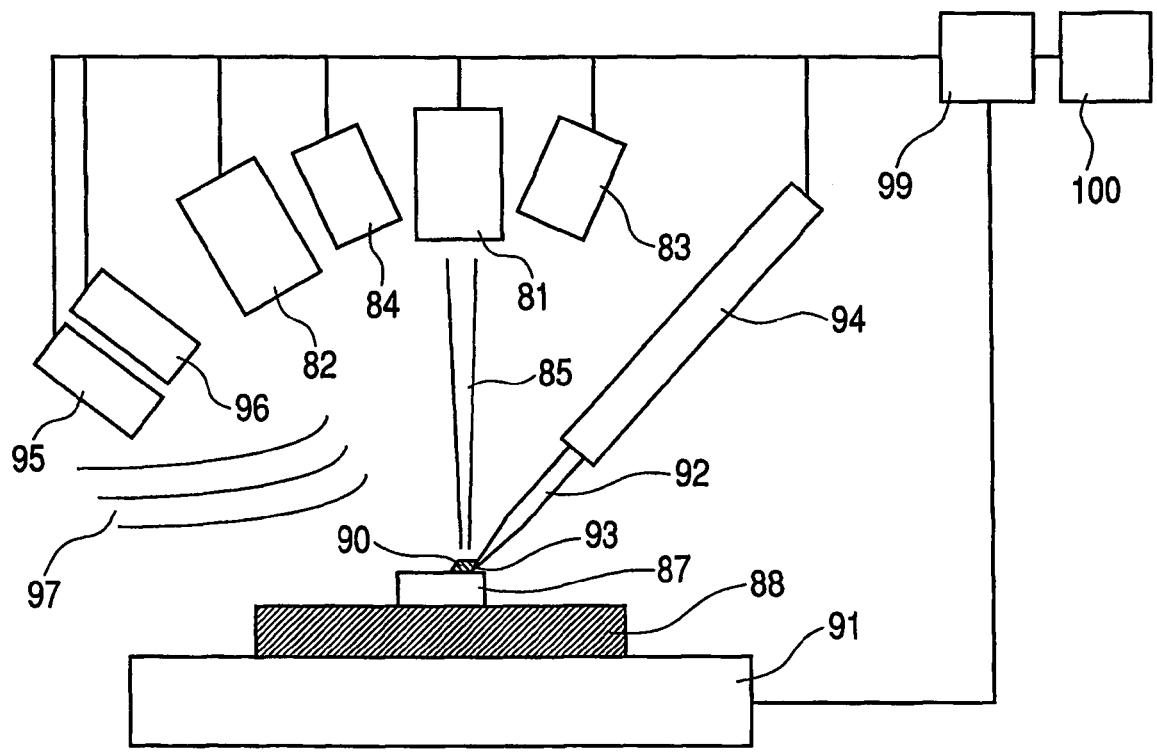
FIG. 26 illustrates an example of the object-moving apparatus of the present invention.
Figure 27A:
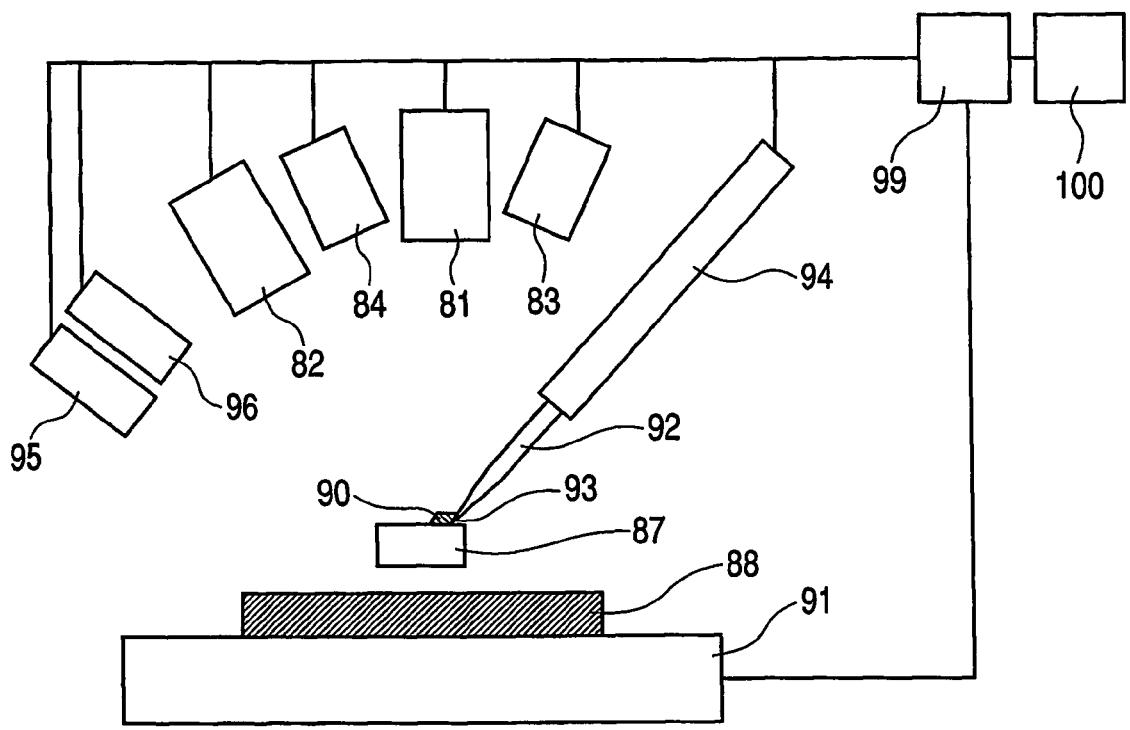
FIGS. 27A and 27B illustrate an example of the object-moving apparatus of the present invention.
Figure 27B:
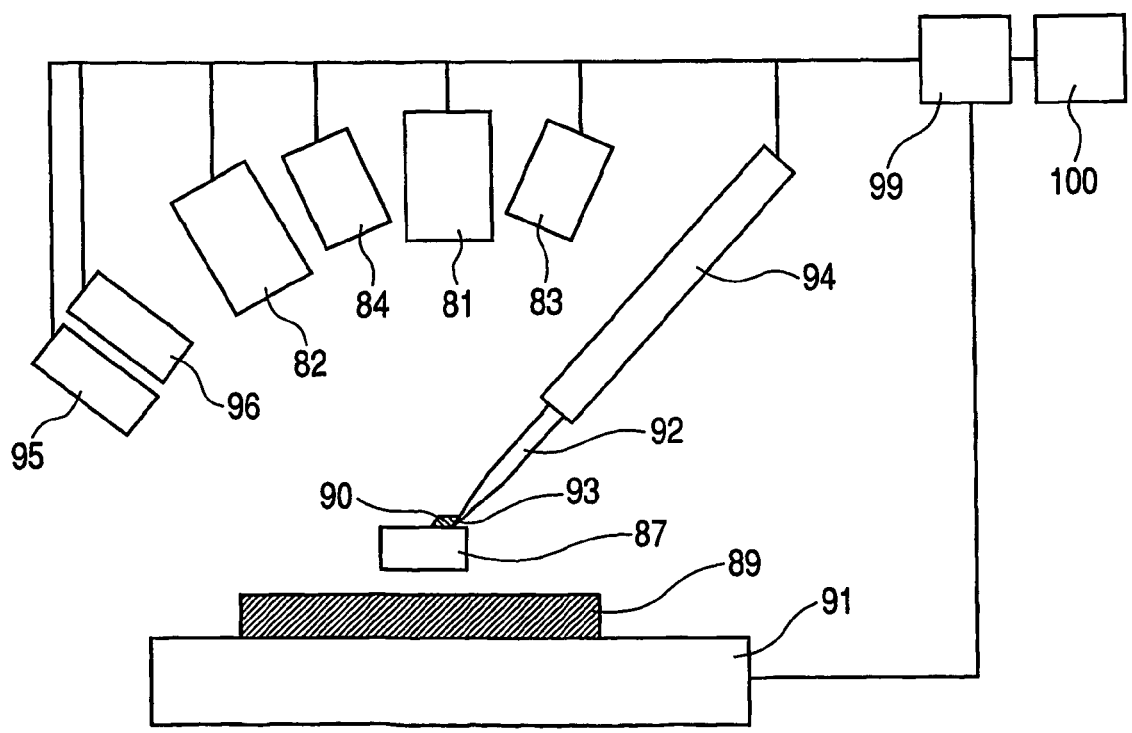
Figure 28:
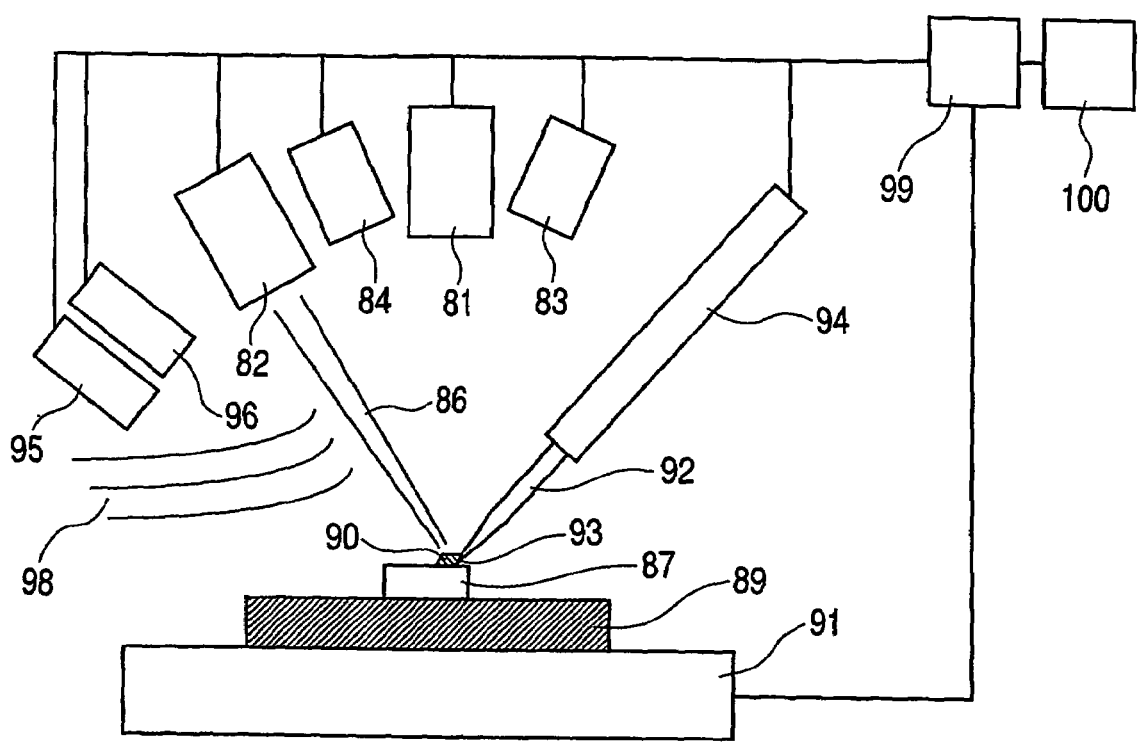
FIG. 28 illustrates an example of the object-moving apparatus of the present invention.

In FIGS. 26 to 28, the numerals denote the following: 81, an irradiation system for irradiating an electron beam as a first corpuscular beam; 82, an irradiation system for irradiating an ion beam as a second corpuscular beam; 83, a detection system for detecting secondary electrons produced as a signal on projection of the electron beam as the first corpuscular beam; 84, a detection system for detecting secondary electrons produced as a signal on projection of the electron beam as the second corpuscular beam; 85, an electron beam as a first corpuscular beam; 86, an ion beam as a secondary corpuscular beam; 87 a movement object; 88, substrate-I; 89; substrate-II; 90, a deposit (containing carbon as the main component).for adhesion; 91, a sample stage; 92, an object-moving means; 93, a tungsten needle constituting a portion of the object-moving means for fixing the object; 94, a driving unit of the object-moving means; 95, a pyrene gas introduction system for introducing a pyrene gas as a deposit-forming gas; 96, an $H_2O$ gas introduction system for introducing an $H_2O$ gas as an etch-assisting gas; 97, a pyrene gas as the deposit-forming gas; 98, an $H_2O$ gas as the etch-assisting gas; 99, a control system; and 100, a monitor display system. The above members are placed, if necessary, in a vacuum chamber (not shown in the drawing), and the chamber is evacuated.

The control system 99 controls and drives the object-moving apparatus by exchanging signals with irradiation system 81 for irradiating an electron beam, irradiation system 82 for irradiating an ion beam, detection system 83 for detecting secondary electrons produced on projection of the electron beam, detection system 84 for detecting secondary electrons produced on projection of the electron beam, sample stage 91, an object-moving means 92, driving unit 94 of the object-moving means, pyrene gas introduction system 95 for introducing a pyrene gas as the deposit-forming gas, $H_2O$ gas introduction system 96 for introducing an $H_2O$ gas as an etch-assisting gas, monitor display system 100, a vacuum control system (not shown in the drawings), and so forth.

In the above operation, electron beam 85 is irradiated by control of irradiation system 81, and the irradiation position of electron beam 85 can be confirmed by detecting the secondary electrons produced by the beam irradiation by detection system 83 with monitor display system 100. Similarly, ion beam 86 is irradiated by control of irradiation system 82, and the irradiation position of ion beam 86 can be confirmed by detecting the secondary electrons produced by the beam irradiation by detection system 84 with monitor display system 100.

Movement object 87, substrate-I 88, substrate-II 89, and so forth are placed on sample stage 91, and are moved together with sample stage 91 by control of sample stage 91.

Object-moving means 92 has at least object-fixing portion 93 of the object-moving means and driving unit 94, conducting movement and other operation by control of the object-moving means.

Pyrene gas 97 is introduced by control of pyrene gas introduction system 95. Deposit 90 (containing carbon as the main component) is formed at a prescribed position by projecting electron beam 85 to the position with introduction of a pyrene gas 97 (FIG. 26).

Similarly, $H_2O$ gas 98 is introduced by control of $H_2O$ gas introduction system 96. Deposit 90 (containing carbon as the main component) at a prescribed position (position of formed deposit 90) is etched selectively by projecting ion beam 86 to the position with introduction of $H_2O$ gas 98 (FIG. 28).

The states of the movement object, substrate, moving means, deposit, and the like can be monitored suitably by detection system 83 for detection of secondary electrons produced on scanning of electron beam 85 scanning (SEM: scanning electron microscopy), although not mentioned specifically.

Evaluation

The object-moving apparatus of this Example was employed for conducting the same movement operation as in Example 1 (movement of a gear-shaped part to a shaft). As the result, the movement was conducted satisfactorily.

Example 4

An object-moving apparatus of the present invention is explained by reference to FIGS. 29 to 31.

Figure 29:
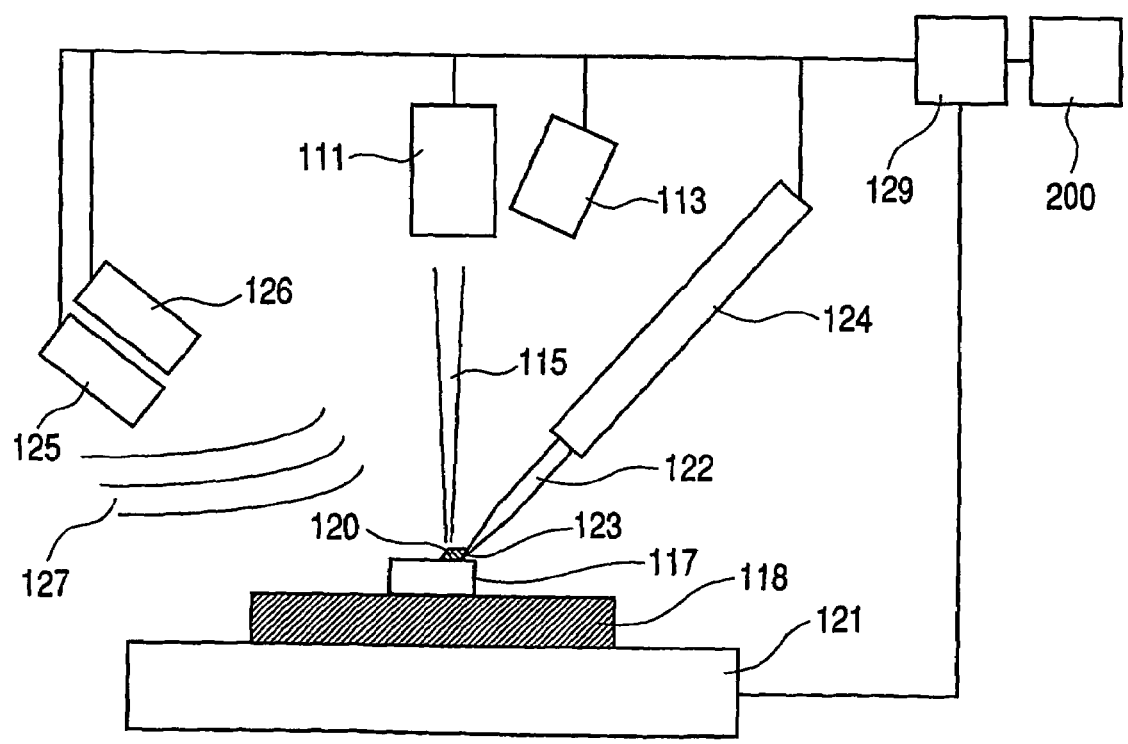
FIG. 29 illustrates an example of the object-moving apparatus of the present invention.
Figure 30A:
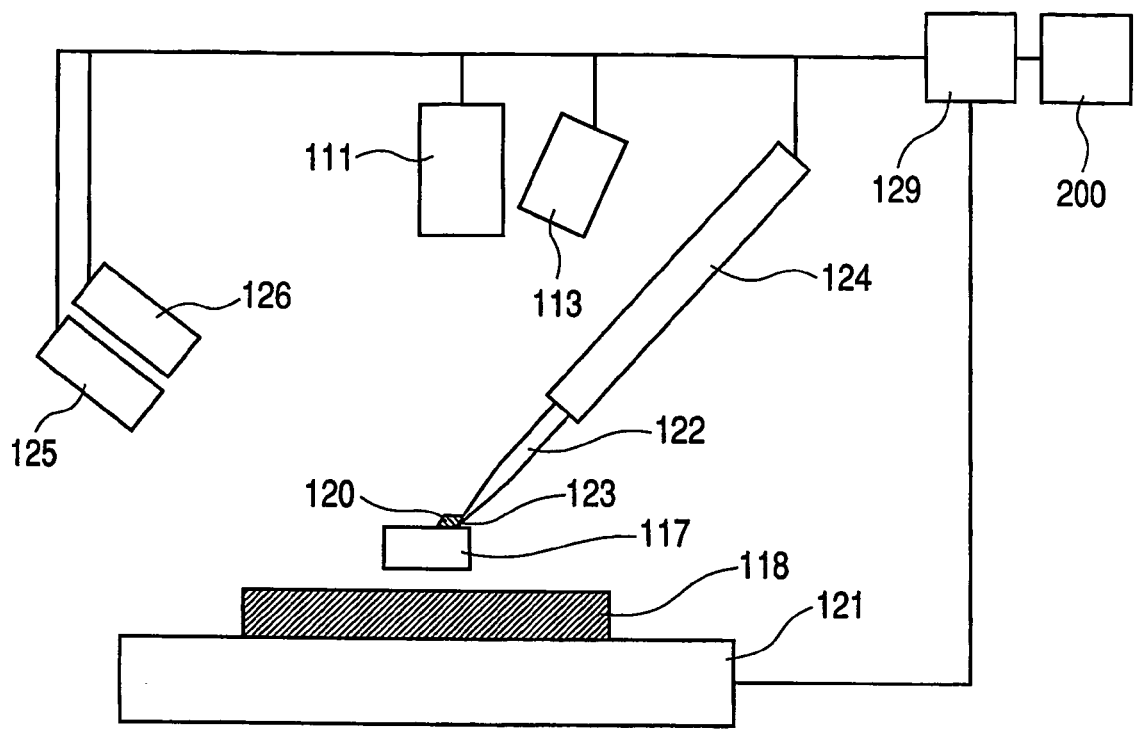
FIGS. 30A and 30B illustrates an example of the object-moving apparatus of the present invention.
Figure 30B:
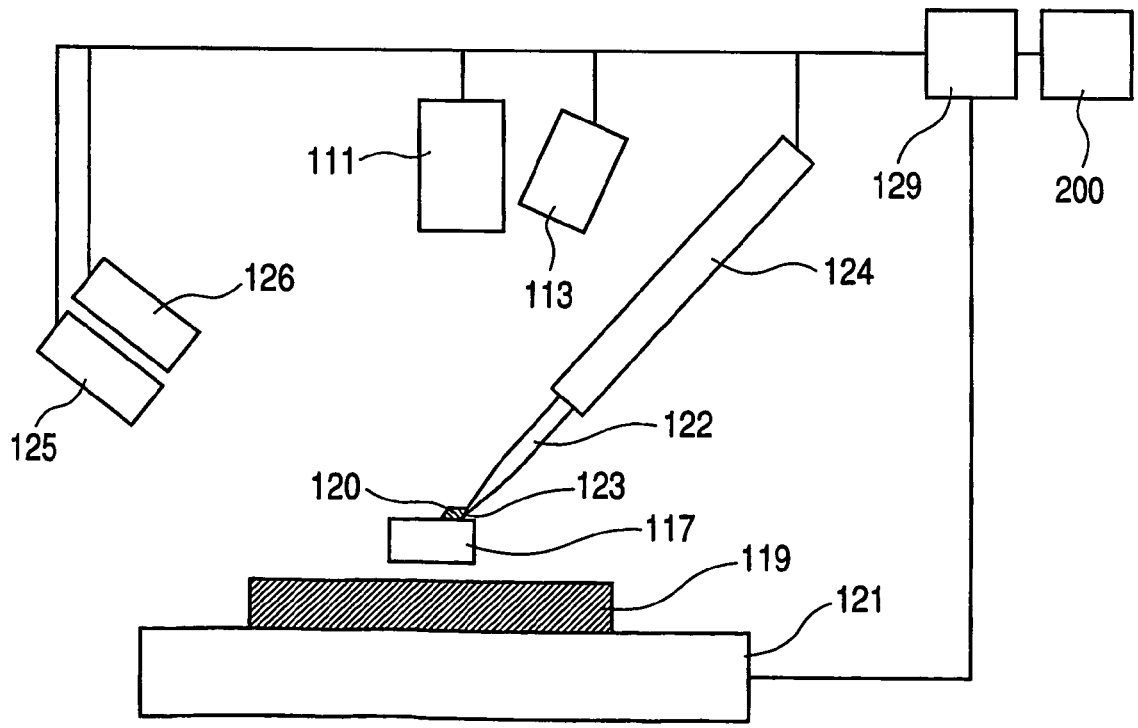
Figure 31:
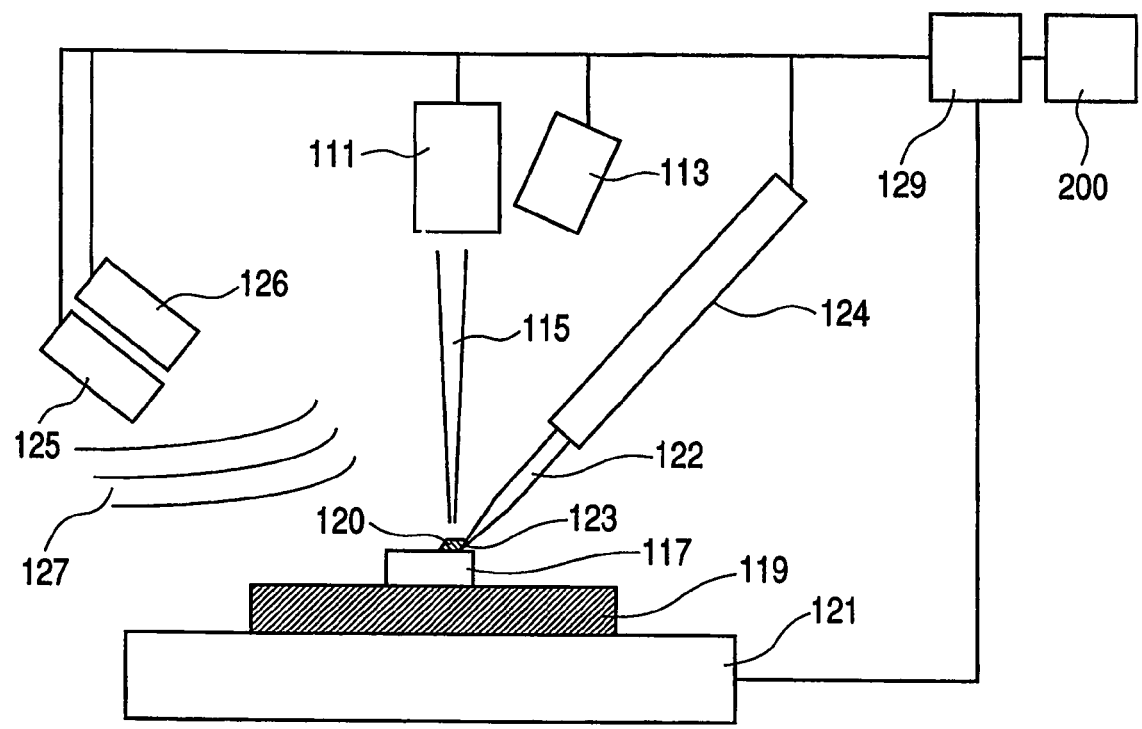
FIG. 31 illustrates an example of the object-moving apparatus of the present invention.

In FIGS. 29 to 31, the numerals denote the following: 111, an irradiation system for irradiating an ion beam serving as a first corpuscular beam as well as a second corpuscular beam; 113, a detection system for detecting secondary electrons produced as a signal on projection of an ion beam serving as the first corpuscular beam and second corpuscular beam; 115, an ion beam serving as the first corpuscular beam as well as the second corpuscular beam; 117, a movement object; 118, substrate-I; 119, substrate-II; 120, a deposit (containing carbon as the main component) for adhesion; 121, a sample stage; 122, an object-moving means; 123, a tungsten needle constituting a portion of the object-moving means for fixing the object; 124, driving unit of the object-moving means; 125, a pyrene gas introduction system for introducing a pyrene gas as the deposit-forming gas; 126, an $H_2O$ gas introduction system for introducing an $H_2O$ gas as an etch-assisting gas; 127, a pyrene gas as the deposit-forming gas; 128, an $H_2O$ gas as an etch-assisting gas; 129, a control system; and 200, a monitor display system. The above members are placed, if necessary, in a vacuum chamber (not shown in the drawing) and the chamber is evacuated by an evacuation system (not shown in the drawings).

The control system 129 controls and drives the object-moving apparatus by exchanging signals with irradiation system 111 for irradiating an ion beam, detection system 113 for detecting secondary electrons produced on projection of the ion beam, sample stage 121, an object-moving means 122, driving unit 124 of the object-moving means, pyrene gas introduction system 125 for introducing a pyrene gas as the deposit-forming gas, $H_2O$ gas introduction system 126 for introducing an $H_2O$ gas as an etch-assisting gas, a monitor display system 200, a vacuum control system (not shown in the drawings), and so forth.

In the above operation, electron beam 115 is irradiated by control of irradiation system 111, and the irradiation position of electron beam 115 can be confirmed by detecting the secondary electrons produced by the beam irradiation by secondary-electron detection system 113 with monitor display system 200.

Movement object 117, substrate-I 118, substrate-II 119, and so forth are placed on sample stage 121, and are moved together with sample stage 121 by control of sample stage 121.

Object-moving means 122 has at least object-fixing portion 123 of the object-moving means and driving unit 124, conducting movement and other operation by control of the object-moving means.

Pyrene gas 127 is introduced by control of pyrene gas introduction system 125. Deposit 120 (containing carbon as the main component) is formed at a prescribed position by projecting ion beam 115 to the position with introduction of pyrene gas 127 (FIG. 29).

Similarly, $H_2O$ gas 128 is introduced by control of $H_2O$ gas introduction system 126. Deposit 120 (containing carbon as the main component) at a prescribed position (position of formed deposit 120) is etched selectively by projecting ion beam 115 to the position with introduction of $H_2O$ gas 128 (FIG. 29).

The states of the movement object, substrate, moving means, deposit, and the like can be monitored suitably by detection system 113 for detection of secondary electrons produced on scanning of ion beam 115 scanning (SIM: scanning ion microscopy). In the above monitoring, the dose of the ion beam is minimized.

Evaluation

The object-moving apparatus of this Example was employed for conducting the same movement operation as in Example 2 (movement of a TEM specimen onto an FIB-TEM observation mesh). As the result, the operation of Example 2 was conducted satisfactorily.

Example 5

Plural gear-shaped parts are moved to plural shaft respectively to produce an assembly of gear-shaped parts. The operation is explained by reference to FIGS. 32 to 43.

In FIGS. 32 to 43, the numerals denote the followings:
151, an electron beam as a first corpuscular beam;
152, an ion beam as a second corpuscular beam; 153, a gear-shaped part as a movement object; 154, substrate-I; 155, substrate-II; 156, a deposit for adhesion (containing carbon as the main constituent);
157, an object-moving means; 158, a tungsten needle as a portion of the object-moving means for fixing the object; 159, a pyrene gas as a deposit-forming gas; 160, an $H_2O$ gas as an etch-assisting gas; 161, a film material constituting a part of substrate-I; 162, a separating layer placed under the film material and constituting a part of substrate-I; 163, shafts on substrate-II; 164, a driving mechanism for the driving means; and 165, holes of the gear-shaped parts.

This Example includes suitably steps of monitoring of states of the movement object, substrate, moving means, deposit, and the like by detection of secondary electrons produced on electron beam scanning (SEM: scanning electron microscopy), although not mentioned specifically.

In this Example, the operation is conducted by using the object-moving apparatus of Example 3.

Figure 32:
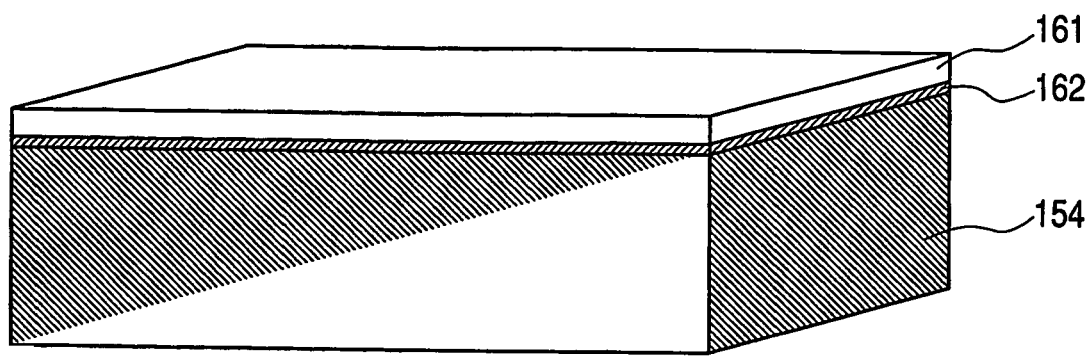
FIG. 32 illustrates an example of the object-moving method (assemblage of gear-shaped parts) of the present invention.

(a) Step of Fixation of Object to Object-Moving Means:

As shown in FIG. 32, substrate-I 154 is provided which has film material 145 and separating layer 146 under the film material.

Figure 33:
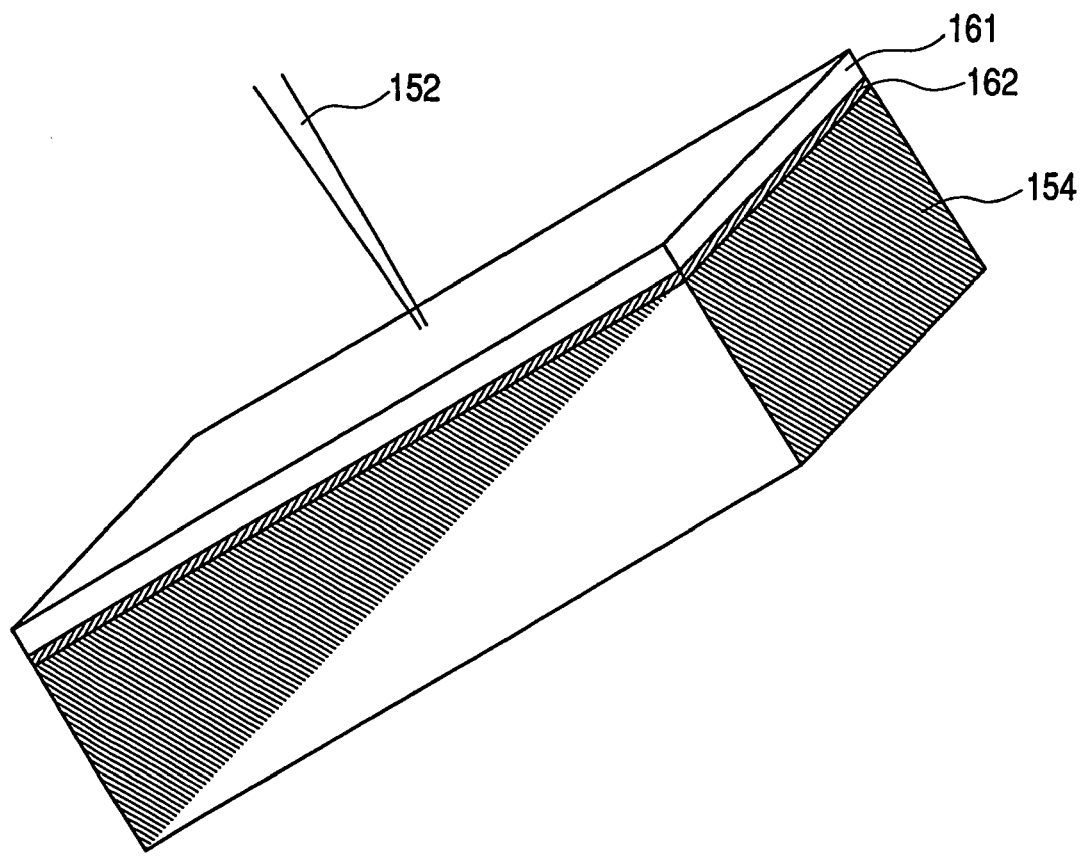
FIG. 33 illustrates an example of the object-moving method (assemblage of gear-shaped parts) of the present invention.

As shown FIG. 33, substrate-I 154 is worked by irradiation of ion beam 152. In FIG. 33, the sample stage (not shown in the drawing) and substrate-I 154 is tilted to project ion beam 152 perpendicularly to substrate-I 154 for the working operation.

Figure 34:
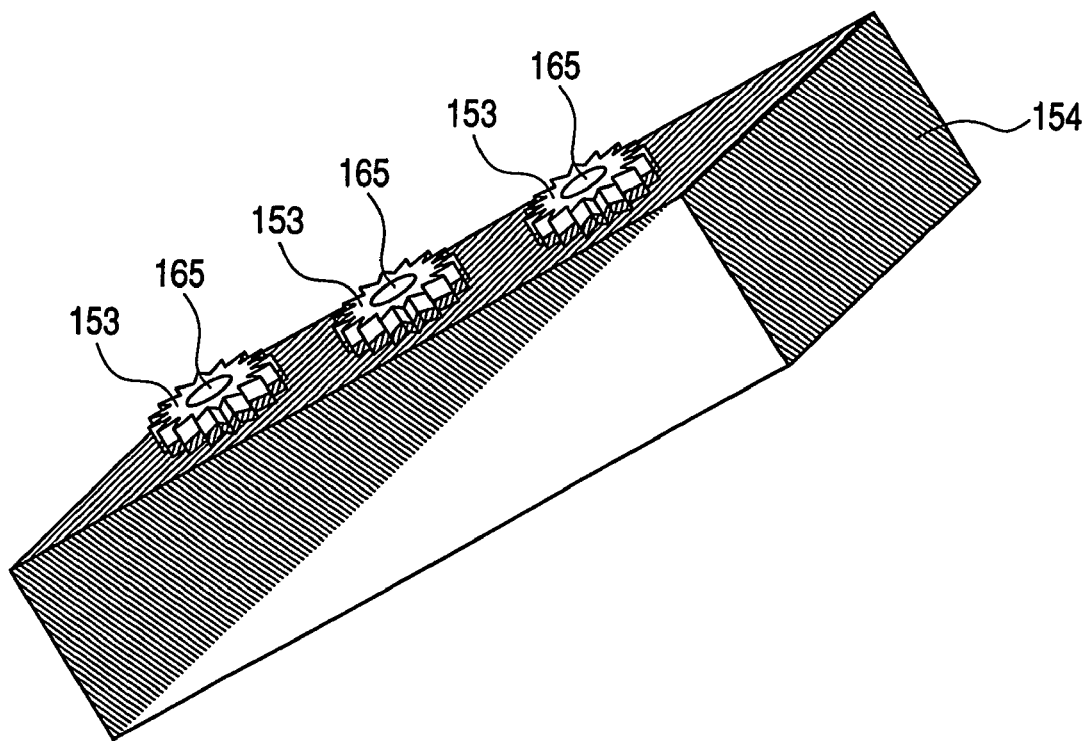
FIG. 34 illustrates an example of the object-moving method (assemblage of gear-shaped parts) of the present invention.

As shown in FIG. 34, three gear-shaped parts 153 are formed on a portion of substrate-I 154 in the working step shown in FIG. 33 as the movement object.

Figure 35:
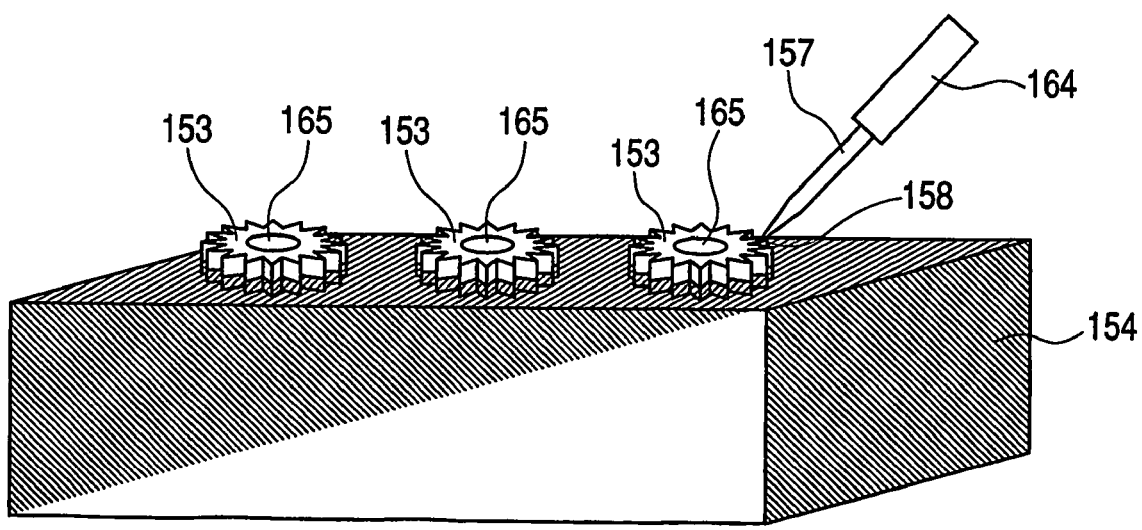
FIG. 35 illustrates an example of the object-moving method (assemblage of gear-shaped parts) of the present invention.

As shown in FIG. 35, object-moving means 157 is brought close to gear-shaped parts 153. Object-moving means 157 comprises tungsten needle 158 and driving mechanism 164: the tungsten needle fixes an object at or around the tip thereof. In this operation, the sample stage (not shown in the drawings) and substrate-I 154 are restored to be horizontal.

Figure 36:
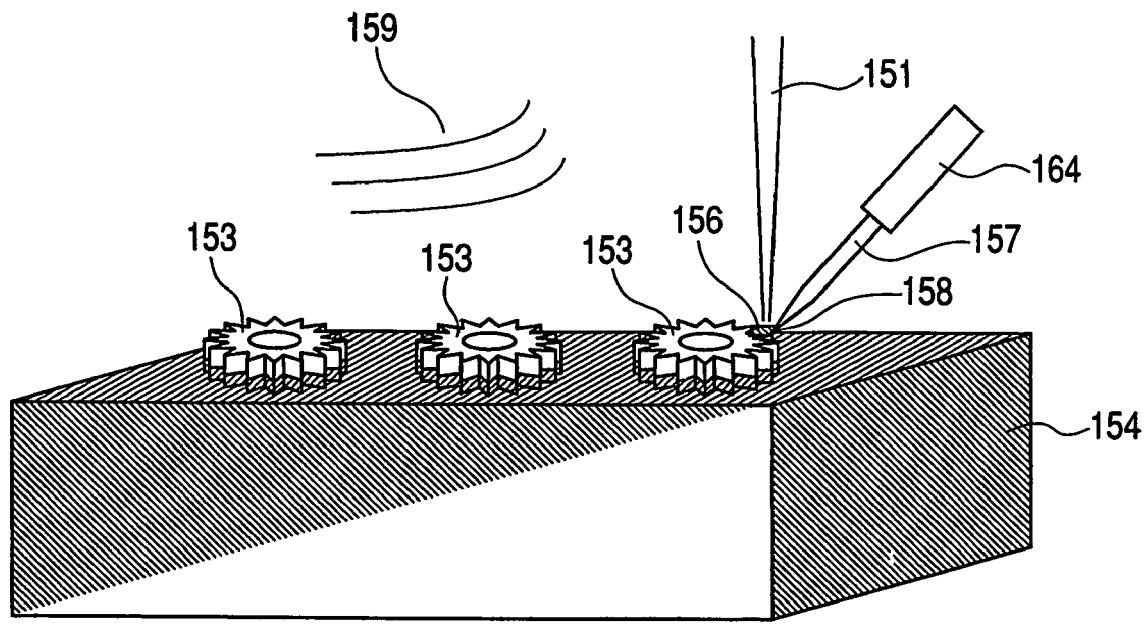
FIG. 36 illustrates an example of the object-moving method (assemblage of gear-shaped parts) of the present invention.

As shown in FIG. 36, with object-moving means 157 kept close to gear-shaped part 153, electron beam 151 is projected to a prescribed position in an atmosphere of pyrene gas 159 to form deposit 156 (containing carbon as the main component) for adhesion of gear-shaped part 153 to tungsten needle 158.

Figure 37:
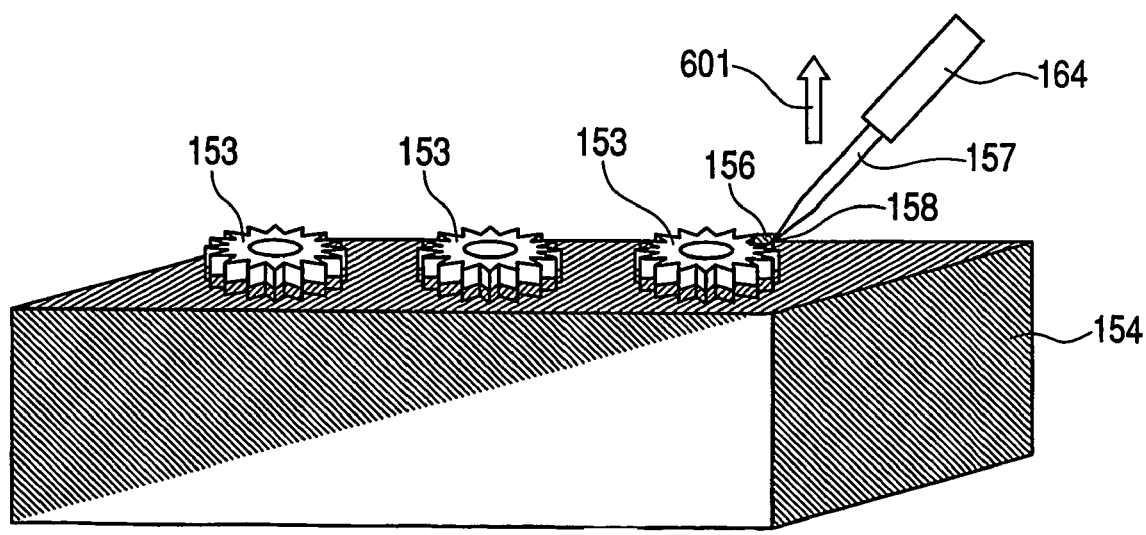
FIG. 37 illustrates an example of the object-moving method (assemblage of gear-shaped parts) of the present invention.
Figure 38:
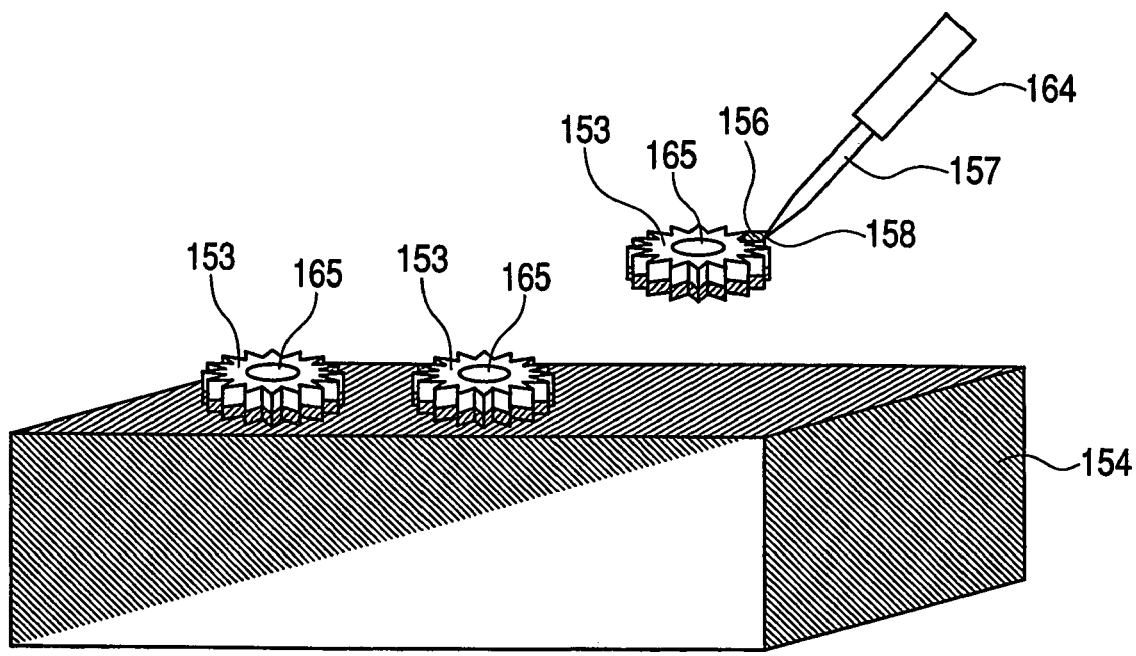
FIG. 38 illustrates an example of the object-moving method (assemblage of gear-shaped parts) of the present invention.

As shown in FIGS. 37 and 38, object-moving means 157 together with gear-shaped part 153 adhering thereto is picked up by application of a force upward. In FIG. 37, arrow 601 denotes the picking-up direction. Separation layer 162 ensures the picking-up of gear-shaped part 153 constituted mainly of film material 161.

As shown in FIG. 37, gear-shaped part 153 is separated from substrate-I 154 by applying a force upward to object-moving means 157 carrying gear-shaped part 153. Separation layer 162 ensures the picking-up of gear-shaped part 153 constituted mainly of film material 161 from substrate-I 154.

(b) Step of Movement of Object by Object-Moving Means:

As shown in FIG. 38, object-moving means 157 having gear-shaped part 153 fixed thereto is picked up.

Figure 39:
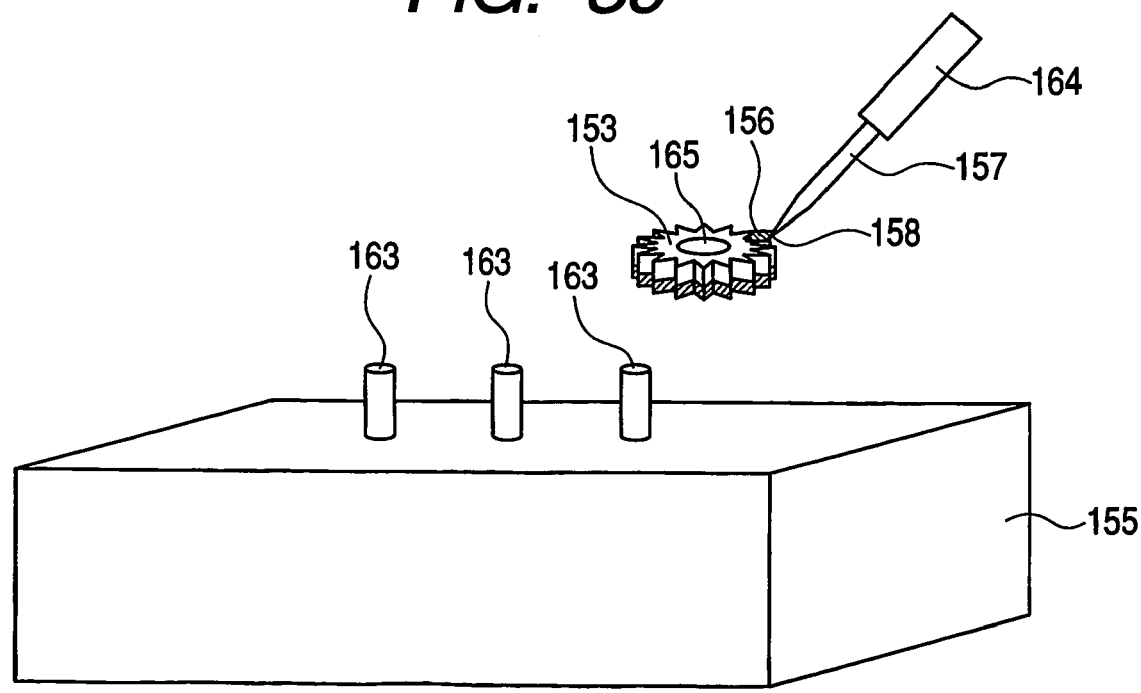
FIG. 39 illustrates an example of the object-moving method (assemblage of gear-shaped parts) of the present invention.

As shown in FIG. 39, substrate-I 154 after removal of gear-shaped part 153 is replaced by substrate-II 155 having three shafts 163.

Figure 40:
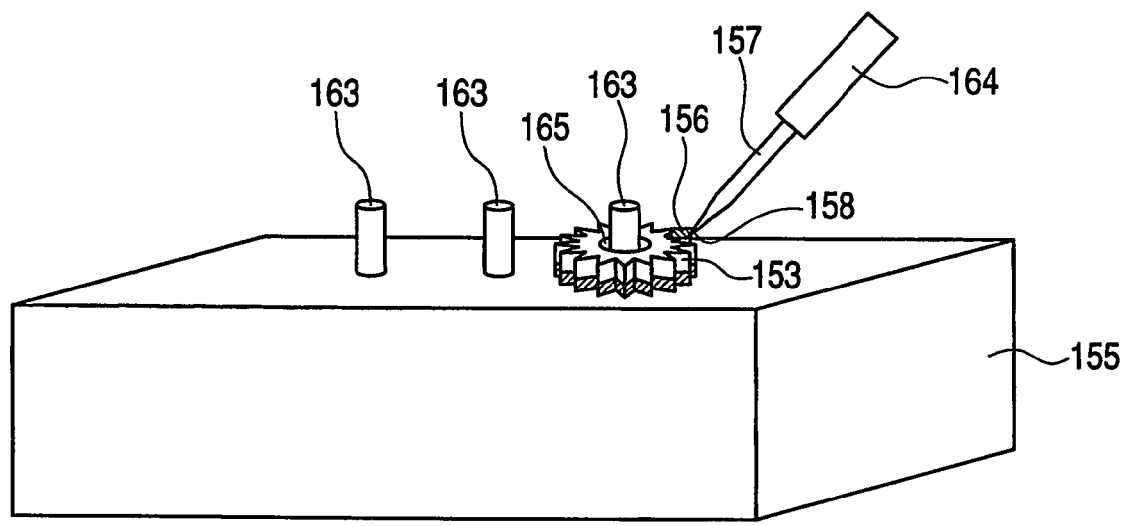
FIG. 40 illustrates an example of the object-moving method (assemblage of gear-shaped parts) of the present invention.

As shown in FIG. 40, object-moving means 157 carrying gear-shaped part 153 is driven to fit hole 165 of the gear-shaped part on to shaft 163 on substrate-II 155.

Figure 41:
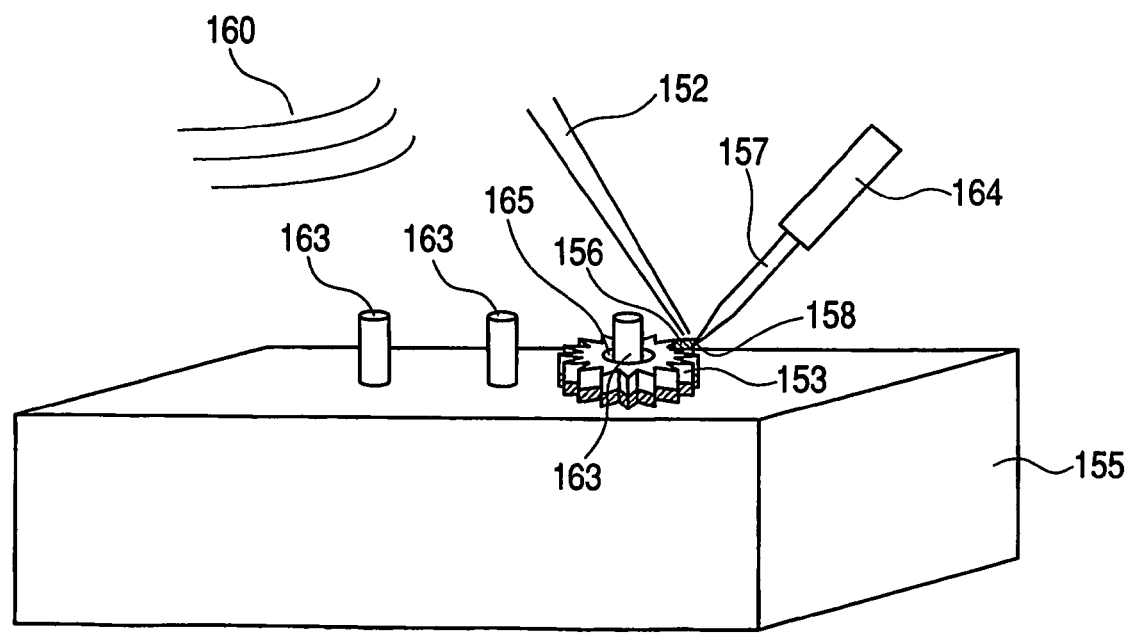
FIG. 41 illustrates an example of the object-moving method (assemblage of gear-shaped parts) of the present invention.

(c) Step of Release of Object from Object-Moving Means:

As shown in FIG. 41, deposit 156 (containing as the main component) for the adhesion is selectively etched by projecting ion beam 152 in $H_2O$ gas 160 to a prescribed position (point of formation of deposit 156 for adhesion of gear-shaped part 153 to object-moving means 157). Thereby gear-shaped part 153 is released from object-moving means 157.

Figure 42:
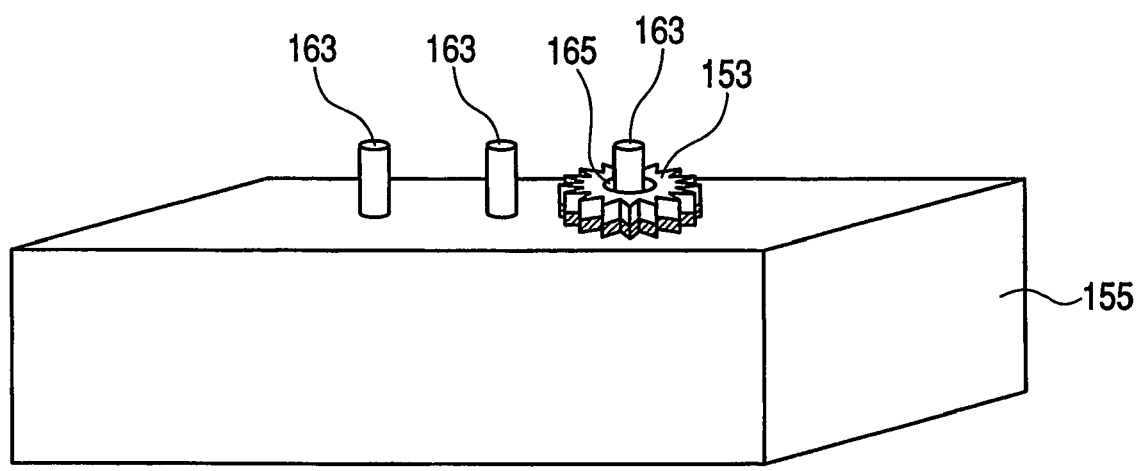
FIG. 42 illustrates an example of the object-moving method (assemblage of gear-shaped parts) of the present invention.
Figure 43:
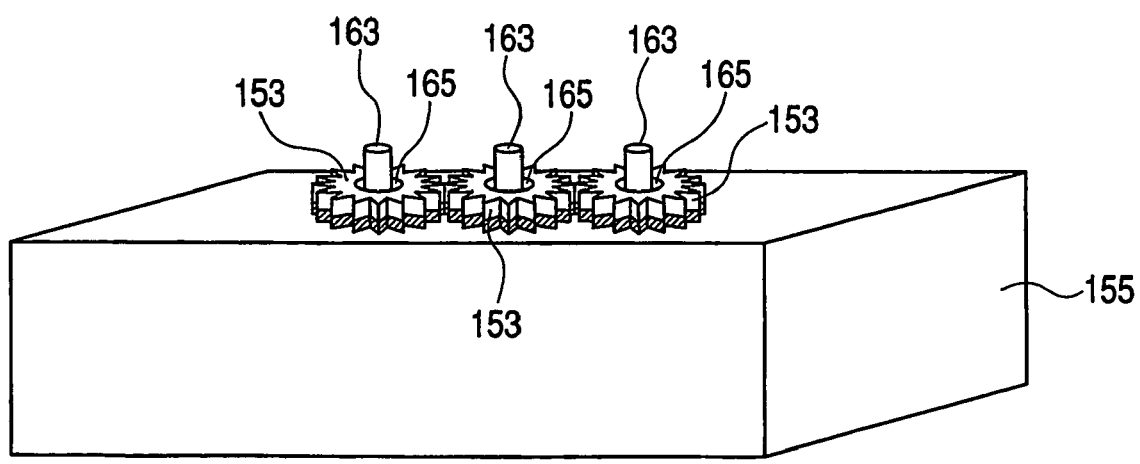
FIG. 43 illustrates an example of the object-moving method (assemblage of gear-shaped parts) of the present invention.

As shown in FIG. 42, the object-moving means is taken away from the movement object.

A set of the steps shown in FIGS. 35 to 42 is repeated twice. As a result, three gear-shaped parts 153 are moved totally to produce assembly of gear-shaped parts as shown in FIG. 42.

As shown in FIGS. 32 to 43, an assembly of the gear-shaped parts is surely produced according to the production method of the present invention.

Evaluation

The moved object (gear-shaped part) after the movement was observed by SEM and found that the damage of the gear-shaped part was little and that no residue of the object-moving means (tip portion of the needle) was found on the gear-shaped part. On the other hand, the tip of the needle (object fixation point) was observed and found that the loss of the tip of the needle was prevented.

INDUSTRIAL APPLICABILITY

As explained above, the present invention achieves the effects below.

(1) Use of the deposit for adhesion ensures pick-up and release of a movement object.
(2) Selective etching of the deposit for the adhesion enables prevention of damage of the movement object on releasing, and remaining of a residue of object-moving means on the movement object after the release.
(3) Selective etching of the deposit for the adhesion prevents consumption of the object-moving means by every movement operation, and eliminates the necessity of reworking or exchanging of the object-moving means after repeated object movement.

The invention claimed is:
1. A method of moving an object comprising a step of fixing the object to an object-moving means, a step of moving the object to a prescribed position by the object-moving means, and a step of releasing the object from the object-moving means;

wherein the step of fixing the object to the object-moving means comprises forming a deposit, for fixation of the object to the object-moving means kept close together, by applying a first corpuscular beam at a site for the fixation in a first gas to form a deposit from a substance constituting the first gas as a source material; and the step of releasing the object from the object-moving means comprises etching selectively the deposit by applying a second corpuscular beam to the position of the deposit in contact with a second gas capable of accelerating etching a main component of the deposit under application of the beam.

2. The method of moving an object according to claim 1, wherein the first gas and the second gas are selected to cause selective etching of a main component of the deposit.

3. The method of moving an object according to claim 1, wherein the method comprises a step of monitoring, by irradiation of a third corpuscular beam, at least one of the object, a substrate and the object-moving means.

4. The method of moving an object according to claim 3, wherein the third corpuscular beam comprises any one of ion beams, electron beams and photon beams.

5. The method of moving an object according to claim 1, wherein the first corpuscular beam is applied by any one of ion beams, electron beams and photon beams.

6. The method of moving an object according to claim 1, wherein the second corpuscular beam is applied by any one of ion beams, electron beams and photon beams.

7. The method of moving an object according to claim 1, wherein the deposit is composed of a substance containing any of carbon, a metal, an oxide, a fluoride and a nitride.

8. A process for production of a device using the method according to claim 1, wherein the process comprises a step of preparing the movement object by working a part of the substrate.

9. The process according to claim 8, wherein the process comprises a step of preparing the movement object by working a less adhesive substance film constituting a part of the substrate.

10. The process according to claim 9, wherein the working of a less adhesive substance film is conducted by FIB irradiation.

11. A process for production of a device using the method according to claim 1, wherein the process comprises a step of preparing the movement object by working a film-shaped substance having a releasing layer and constituting a part of the substrate.

12. The process according to claim 11, wherein the working of a less adhesive substance film is conducted by FIB irradiation.

13. An object-moving apparatus, comprising a means for fixing a movement object to an object-moving means, an object-moving means, and a means for releasing the movement object from the object-moving means;

wherein the means for fixing a movement object to an object-moving means comprises a means for holding the movement object and the object-moving means close together, and a means for forming a deposit a raw material of which is a principal component of a first gas by irradiating with a first corpuscular beam a site for the fixation in the first gas; and the means for releasing the movement object from the object-moving means comprises a means for irradiating with a second corpuscular beam a position of the deposit in a second gas.

14. The object-moving apparatus according to claim 13, wherein the first gas and the second gas are selected to cause selective etching of a main component of the deposit in the second gas.

15. The object-moving apparatus according to claim 13, wherein the apparatus further comprises a means for irradiating a third corpuscular beam for observation of states of the movement object and/or a substrate and/or the object-moving means.

16. The object-moving apparatus according to claim 15, wherein the third corpuscular beam includes an ion beam, an electron beam and a photon beam.

17. The object-moving apparatus according to claim 13, wherein the first corpuscular beam includes an ion beam, an electron beam and a photon beam.

18. The object-moving apparatus according to claim 13, wherein the second corpuscular beam includes an ion beam, an electron beam and a photon beam.

19. The object-moving apparatus according to claim 13, wherein the deposit is composed of a substance containing any of carbon, a metal, an oxide, a fluoride and a nitride.

\* \* \* \* \*

UNITED STATES PATENT AND TRADEMARK OFFICE
CERTIFICATE OF CORRECTION

| | |
|---|---|
| PATENT NO. | : 7,173,253 B2 |
| APPLICATION NO. | : 10/542145 |
| DATED | : February 6, 2007 |
| INVENTOR(S) | : Toshiaki Aiba |

It is certified that error appears in the above-identified patent and that said Letters Patent is hereby corrected as shown below:

COLUMN 2:

Line 5, "above-manipulation" should read --above manipulation--.
Line 67, "deposit" should read --deposit,--.

COLUMN 3:

Line 1, "gas" should read --gas,--.

COLUMN 5:

Line 38, "a-movement" should read --a movement--.

COLUMN 7:

Line 7, "object," should read --object--.

COLUMN 9:

Line 36, "deposit-forming" should read --each-assisting--.

COLUMN 15:

Line 6, "component). for" should read --component) for--.

COLUMN 17:

Line 44, "material 145" should read --material 161--, and "layer 146" should read --layer 162--.

COLUMN 18:

Line 24, "(containing" should read --(containing carbon--.

UNITED STATES PATENT AND TRADEMARK OFFICE
CERTIFICATE OF CORRECTION

PATENT NO.       : 7,173,253 B2
APPLICATION NO.  : 10/542145
DATED            : February 6, 2007
INVENTOR(S)      : Toshiaki Aiba It is certified that error appears in the above-identified patent and that said Letters Patent is hereby corrected as shown below:

COLUMN 20:

Line 15, "deposit" should read --deposit,--.
Line 16, "gas" should read --gas,--.

Signed and Sealed this

Fourteenth Day of April, 2009

JOHN DOLL
*Acting Director of the United States Patent and Trademark Office*